(12) United States Patent
Yamamura

(10) Patent No.: US 7,474,583 B2
(45) Date of Patent: Jan. 6, 2009

(54) SEMICONDUCTOR MEMORY DEVICE

(75) Inventor: Ikuhiro Yamamura, Tokyo (JP)

(73) Assignee: Sony Corporation (JP)

( * ) Notice: Subject to any disclaimer, the term of this patent is extended or adjusted under 35 U.S.C. 154(b) by 135 days.

(21) Appl. No.: 11/645,583

(22) Filed: Dec. 27, 2006

(65) Prior Publication Data
US 2007/0127298 A1    Jun. 7, 2007

(30) Foreign Application Priority Data

Dec. 28, 2005   (JP) ............................. 2005-377923
Nov. 29, 2006   (JP) ............................. 2006-322660

(51) Int. Cl.
*G11C 5/14* (2006.01)
(52) U.S. Cl. .................. 365/226; 365/154; 365/202; 365/205; 365/189.09
(58) Field of Classification Search ................ 365/226, 365/154, 202, 205, 189.09
See application file for complete search history.

(56) References Cited

U.S. PATENT DOCUMENTS

| | | | | |
|---|---|---|---|---|
| 4,630,238 A | * | 12/1986 | Arakawa | 365/185.1 |
| 5,541,529 A | * | 7/1996 | Mashiko et al. | 326/39 |
| 6,009,023 A | * | 12/1999 | Lu et al. | 365/189.11 |
| 6,097,641 A | * | 8/2000 | Lu et al. | 365/189.09 |
| 6,115,309 A | * | 9/2000 | Coleman, Jr. | 365/208 |
| 7,158,419 B2 | * | 1/2007 | Lee et al. | 365/185.29 |

FOREIGN PATENT DOCUMENTS

JP     02003123482 A   *   4/2003

OTHER PUBLICATIONS

Zhang, K. et al., A 3-GHz 70Mb SRAM in 65nm CMOS Technology with integrated Column-Based Dynamic Power Supply:, 2005 IEEE International Solid-State Circuit Conference, Session 26/ Non-Volatile Memory/ 26.1, pp. 474.
Bhavnagarwala, Azeez J. et al., "A Transregional CMOS SRAM with Single, Logic $V_{DD}$ and Dynamic Power Rails", 2004 Symposium on VLSI Circuit 2004, Digest on Technical Papers, p. 292-293.

* cited by examiner

*Primary Examiner*—Viet Q Nguyen
(74) *Attorney, Agent, or Firm*—Rader Fishman & Grauer PLLC; Ronald P. Kananen

(57) ABSTRACT

A semiconductor memory device has SRAM cells each including: a pair of inverters; a feed control switch connected between a feeding point of the pair of inverters and a power supply voltage supply line; and a boosting device configured to boost a voltage of the feeding point electrically isolated from the power supply voltage supply line by the feed control switch.

4 Claims, 28 Drawing Sheets

NON-REWRITABLE CELL: READOUT

REWRITABLE CELL: BIT INVERSION

1ST CONTACT, 1ST METAL

1ST METAL, 2ND CONTACT, 2ND METAL

2ND METAL, 3RD CONTACT, 3RD METAL

3RD METAL, 4TH CONTACT, 4TH METAL

1ST CONTACT, 1ST METAL

1ST METAL, 2ND CONTACT, 2ND METAL

2ND METAL, 3RD CONTACT, 3RD METAL

3RD METAL, 4TH CONTACT, 4TH METAL

1ST CONTACT, 1ST METAL

1ST METAL, 2ND CONTACT, 2ND METAL

2ND METAL, 3RD CONTACT, 3RD METAL

3RD METAL, 4TH CONTACT, 4TH METAL

NON-REWRITABLE CELL: READOUT

REWRITABLE CELL: BIT INVERSION

SEMICONDUCTOR MEMORY DEVICE

CROSS REFERENCES TO RELATED APPLICATIONS

The present invention contains subject matter related to Japanese Patent Applications JP 2005-377923 and JP 2006-322660 filed in the Japanese Patent Office on Dec. 28, 2005 and Nov. 29, 2006, respectively, the entire contents of which being incorporated herein by reference.

BACKGROUND OF THE INVENTION

1. Field of the Invention

The present invention relates to a semiconductor memory device having an SRAM cell which stores data by two pairs of inverters.

2. Description of Related Art

An SRAM (Static Random Access Memory) is widely used as a multi-purpose memory and a mixed logic memory. FIG. 23 shows a circuit diagram depicting an SRAM cell in a six transistor configuration having a P-channel MOS transistor (hereinafter, called PMOS) as a load.

The memory cell 100 has two load transistors P1 and P2 formed of a PMOS transistor, two driver transistors N1 and N2 formed of an N-channel MOS transistor (NMOS), and two transfer transistors N3 and N4 formed of an NMOS transistor.

Between a power supply node NDdd in the cell to which power is supplied from a supply line of a power supply voltage Vdd (hereinafter, a Vdd supply line 4) and a supply line 2 at reference voltage (for example, ground voltage), the load transistor Pi is vertically connected to the driver transistor N1, and the load transistor P2 is vertically connected to the driver transistor N2.

The gates of the load transistor P2 and the driver transistor N2 are together connected to the connecting point of the load transistor Pi to the driver transistor N1 to form a storage node ND1. Similarly, the gates of the load transistor Pi and the driver transistor N1 are together connected to the connecting point of the load transistor P2 to the driver transistor N2 to form a storage node ND2.

One of the source and the drain of a transfer transistor N3 is connected to the storage node ND1, and the other is connected to a bit line BL, and the gate is connected to a word line WL. Similarly, one of the source and the drain of a transfer transistor N4 is connected to the storage node ND2, the other is connected to a bit complementary line BL_, and the gate is connected to the word line WL.

This SRAM 100 in the six transistor configuration has high compatibility with logic process, and can be operated at high speed. However, the SRAM has disadvantages that operating electric power and standby electric power are great.

As one scheme of solving the disadvantages, there is a scheme that the voltage supplied to the SRAM is controlled.

As one example, there is a scheme in which an SRAM cell is driven at high voltage when it is necessary to operate the SRAM at high speed, whereas the SRAM is driven at low voltage when it is operated at low speed, or it is in standby, whereby power consumption is suppressed.

However, when the SRAM is driven at low voltage, an SNM (Static Noise Margin) indicating the stability of the SRAM becomes small, and particularly, a problem arises that data is written wrong in read operation. Hereinafter, the relation between the operating voltage and the SNM will be described.

FIG. 24A shows a single inverter in the SRAM cell 100. Here, for the sake of simplification, the load is replaced by a resister. A load resister R and an NMOS transistor NT (the driver transistor N1 or N2) are vertically connected between the power supply voltage Vdd and the ground voltage, and an output voltage Vout is taken out of the connecting point. An input voltage Vin is applied to the gate of the NMOS transistor NT.

Two pairs of the inverters like this are arranged in the cell, in which the inverters are connected to each other so that one of the input voltage Vin of the pairs is the output voltage Vout of the other pair and one of the output voltage Vout of the pairs is the input voltage Vin of the other pair (see FIG. 23). In addition, as shown in FIG. 23, the node of the output voltage Vout is connected to one of the pair of the bit lines BL and BL_ through the transfer transistor (N3 or N4 in FIG. 23).

FIG. 24B shows the input/output characteristics of the inverter. In the drawing, a solid line indicates a characteristic curve (first characteristic curve) 101 of a first inverter, and a broken line indicates a characteristic curve (second characteristic curve) 102 of a second inverter.

In the first characteristic curve 101, when the input voltage Vin is increased from zero, the NMOS transistor NT is first turned off, and the output voltage Vout maintains high level near the power supply voltage Vdd. However, when the NMOS transistor NT is started to turn on, the drain current Ids is carried through the load resister R. Thus, the output voltage Vout drops rapidly, and it is stabilized at low level that is decided by the value of the ON resistance of the NMOS transistor NT and the value of the load resister R.

Since the second inverter has the characteristics that the input and the output of the first inverter are inverted, the second characteristic curve is the curve as indicated by the broken line shown in FIG. 24B.

Since two intersection points of the first and the second characteristic curves 101 and 102 are the stable points for the operation, in the SRAM cell, the potential difference between the two intersection points is stored as binary information. The stable points (operating points P1 and P0) are determined as they satisfy the equation $(Vdd-Vout)/R = Ids(Vout, Vin)$.

The difference between the input voltage $V_H$ at the operating point P1 and the input voltage $V_L$ at the operating point P0 is referred to as a logic amplitude $\Delta V$. In addition, the input voltage difference between the intersection point P1 and the inflection point close thereto is represented by a static noise margin $SNM_H$ on the high level side, and the input voltage difference between the intersection point P0 and the inflection point close thereto is represented by a static noise margin $SNM_L$ on the low level side.

The description above is the case of using the load resister R. FIG. 25 shows a characteristic diagram depicting the case in which the load resister R is replaced by the PMOS transistor and the power supply voltage Vdd is varied.

When the first characteristic curves 101 are compared with each other between FIG. 25 and FIG. 24B, the curve shown in FIG. 25 is more smoothly varied on the high level side of the input voltage Vin. This is because the load transistor functions as a variable resister. On the other hand, the curve is supposed to smoothly vary on the low level side of the input voltage Vin, but it is varied sharp because of the existence of the transfer transistor.

FIG. 25 shows a table depicting the static noise margin $SMN_L$ on the low level side when the power supply voltage Vdd is gradually decreased from 1.4 V to 0.6 V. In association with the decrease of the power supply voltage, the reduction in the static noise margin SNM is a factor of read error in particular.

As a scheme to cope with this disadvantage, a scheme is proposed in which two voltages are supplied to a memory cell (see K. Zhang, etc., "A 3-GHz 70 Mb SRAM in 65 nm CMOS Technology with integrated Column-Based Dynamic Power Supply," ISSC 2005/SESSION 26/NON-VOLATILE MEMORY/26.1, p. 474 (Non-Patent Reference 1)).

As another scheme, a scheme is proposed in which the voltage of a memory cell is boosted in the memory operation of an SRAM (see Azeez J. Bhavnagarwala etc., "A Transistor CMOS SRAM with Single, Logic Vdd and Dynamic Power Rails", VLSI Circuit 2004, P.292 (Non-Patent Reference 2)).

FIG. 26A shows a circuit diagram described in Non-Patent Reference 2, and FIG. 26B shows an illustration depicting the capacitive coupling of word lines.

In the circuit, a memory cell array is separated into small scale subarrays 110, and a circuit is arranged to boost word lines at every subarray. The booster circuit is provided with a pair of PMOSs 111 in which the gate is connected to each of word lines WL0 to WL2, and a supply line VDD of power supply voltage is connected to power lines PL0 to PL3 through each of the PMOSs 111. Here, attention is focused on the word line WL1. When a pulse 112 at high level rises, two PMOSs 111 having the gate thereof connected to the word line WL1 are turned off. Therefore, power supply to the power lines PL1 and PL2 at power supply voltage is stopped, the power lines PL1 and PL2 are boosted from the power supply voltage level to a higher level 113. As shown in FIG. 26B, this pressure rise occurs because each of the power lines PL1 and PL2 is capacitive coupled to the word line WL1 on the side wall (combined capacitance: $C_c$).

At this time, in all the SRAM cells connected to the word line WL1 in the subarray 110, the connecting point of the power lines PL1 and PL2 is boosted to the level 113 higher than the power supply voltage.

Thus, the read operation is accelerated.

SUMMARY OF THE INVENTION

The SRAM described in Non-Patent Reference 1 has a problem that it is necessary to provide a plurality of power sources and to provide additional selection switches, leading to increased circuit scale.

In the SRAM described in Non-Patent Reference 2, the connecting points (feeding points) of the power lines PL of all the SRAM cells connected to the same word line are boosted from the power supply voltage level in data read (it is the same in data write). This is effective itself to accelerating read operation, but it leads to the following disadvantage when write operation is limited to a part of the SRAM cells connected to a single word line in the subarray 110.

FIG. 27A shows the relation between the voltage (hereinafter, called cell voltage) Vcell of the feeding point of a data rewrite cell (bit inversion cell) and the potential of the word line.

In addition, FIG. 27B shows the same relation of a non-rewrite cell connected to the same word line. The stored data of the non-rewrite cell might be damaged by turning on the transfer transistors N3 and N4 as similar to the data rewrite cell. Thus, it is necessary that data is read at this time and then the data is rewritten.

However, as described above, the same power line PL in the subarray 110 is driven, and the potential of the power line PL is the cell voltage Vcell as it is. Therefore, as shown in FIGS. 27A and 27B, the cell voltage Vcell is varied in the same way in all the SRAM cells connected to the same word line regardless whether the SRAM cell is a target for data rewrite.

More specifically, in the rewrite cell shown in FIG. 27A, penetration current is carried through two inverters in the cell at bit inversion. Thus, the cell voltage Vcell immediately drops in response to the rise of the potential of the word line. In the typical cell that the feeding point is electrically fixed to the power supply voltage line (see FIG. 23), the cell voltage drop does not occur, or it is restored promptly when it occurs. However, in the configuration shown in FIGS. 26A and 26B in which the power line PL is floated, the electric charge stored in wiring capacitance is consumed and the cell voltage Vcell remains low. When the potential of the word line drops, the PMOS 111 shown in FIG. 26A is turned on. Therefore, the cell voltage Vcell is returned to the initial state.

For the rewrite cell, the cell voltage change contributes to an advantage that bit inversion tends to occur. However, in a read cell, it is basically desired to increase the potential of the cell voltage Vcell more than the initial value, but it drops instead. This leads to a disadvantage that the possibility of the occurrence of read error is high in which data of bit inversion is immediately read as correct data.

In order to cope therewith, it is necessary that the potential of the word line is driven at more increased level, or that the combined capacitance $C_c$ shown in FIG. 26B is set greater.

Accordingly, as shown in FIGS. 28A and 28B, such a state can be implemented that the cell voltage Vcell is higher than the initial state by $\Delta V$ when the word line is driven. This is advantageous for accelerating readout speed. However, this leads to a disadvantage because bit inversion is hard to occur in rewrite operation.

As described above, in the configuration of FIG. 26A, when a part of the cells connected to the word line is desired to rewrite, a tradeoff exists with regard to the easiness of rewrite in this rewrite and the readout of the other cells and to high speed read (or correct read).

On the other hand, when all the cells connected to the same word line are the write target, or when they are to rewrite, the potential of the word line is driven as shown in FIGS. 27A and 27B in data write, and the potential of the word line is driven as shown in FIGS. 28A and 28B in data read, whereby the tradeoff is not generated.

However, in the circuit of FIG. 26A, when the number of cells for write at one time is reduced, the scale of the subarray 110 is correspondingly separated into smaller areas and a booster circuit is necessary for each subarray. In addition, since it is difficult to change the combined capacitance between data write and data read, it is necessary to change the drive voltage of the word line, which leads to a complicated configuration of a word line drive circuit (not shown).

As described above, in the SRAM described in Non-Patent Reference 2, it is necessary to provide such a configuration that data is written in all the memory cells connected to the same word line, which is accompanied by a disadvantage that a limitation is imposed on the array of the memory cell to have this configuration.

It is desirable to achieve stable write operation and accelerated read operation, or prevention of error operation at the same time when a part of memory cells connected to the same word line is written.

A semiconductor memory device according to an embodiment of the invention is a semiconductor memory device having SRAM cells each including: a pair of inverters; a feed control switch connected between a feeding point of the pair of inverters and a power supply voltage supply line; and a boosting device configured to boost a voltage of the feeding point electrically isolated from the power supply voltage supply line by the feed control switch.

Preferably, in an embodiment of the invention, the SRAM cell each includes: a first transfer transistor arranged between an input of a second inverter configuring the pair of inverters and a first bit line and configured to turn on by changing a word line to active level; and a second transfer transistor arranged between an input of a first inverter configuring the pair of inverters and a second bit line and configured to turn on by changing the word line to active level, wherein the feed control switch is configured to turn on by changing the word line from non-active level to the active level.

Preferably, in an embodiment of the invention, the feed control switch includes a P-channel transistor in which a gate is connected to a word line.

Preferably, in an embodiment of the invention, the boosting device includes a capacitor which couples a word line to the feeding point by capacitive coupling.

Preferably, in an embodiment of the invention, the boosting device includes a capacitor (MOS capacitance) in an insulating gate transistor structure in which a source or a drain is connected to a word line, and a gate is connected to the feeding point.

A semiconductor memory device according to an embodiment of the invention is a semiconductor memory device having SRAM cells each including: a pair of inverters; two transfer transistors configured to control a connection between two storage nodes of the pair of inverters and a bit line pair; and a feed control transistor connected between a feeding point of the pair of inverters and a power supply voltage supply line and configured to turn on in a storage state and to turn off when the two storage nodes of the pair of inverters are electrically connected to the bit line pair.

Preferably, in an embodiment of the invention, each of the two transfer transistors is an N-channel transistor, and the feed control transistor is a P-channel transistor in which a gate is connected to a wordline that controls the two transfer transistors.

Preferably, in an embodiment of the invention, the feed control transistor includes: a first feed control transistor connected between a feeding point of one of the pair of inverters and the power supply voltage supply line, and a second feed control transistor connected between a feeding point of the other of the pair of inverters and the power supply voltage supply line.

According to an embodiment of the invention, an advantage is provided that stable write operation and accelerated read operation or prevention of error operation can be achieved at the same time when a part of memory cells connected to the same word line is written.

DETAILED DESCRIPTION OF THE INVENTION

Hereinafter, embodiments of a semiconductor memory device according to an embodiment of the invention will be described with reference to the drawings as an example is taken when an embodiment of the invention is adapted to a PMOS load SRAM cell in the six transistor configuration. In addition, the invention can be adapted to the case in which the PMOS load transistor of the six transistor SRAM cell is replaced by a resister.

FIRST EMBODIMENT

Figure 1:
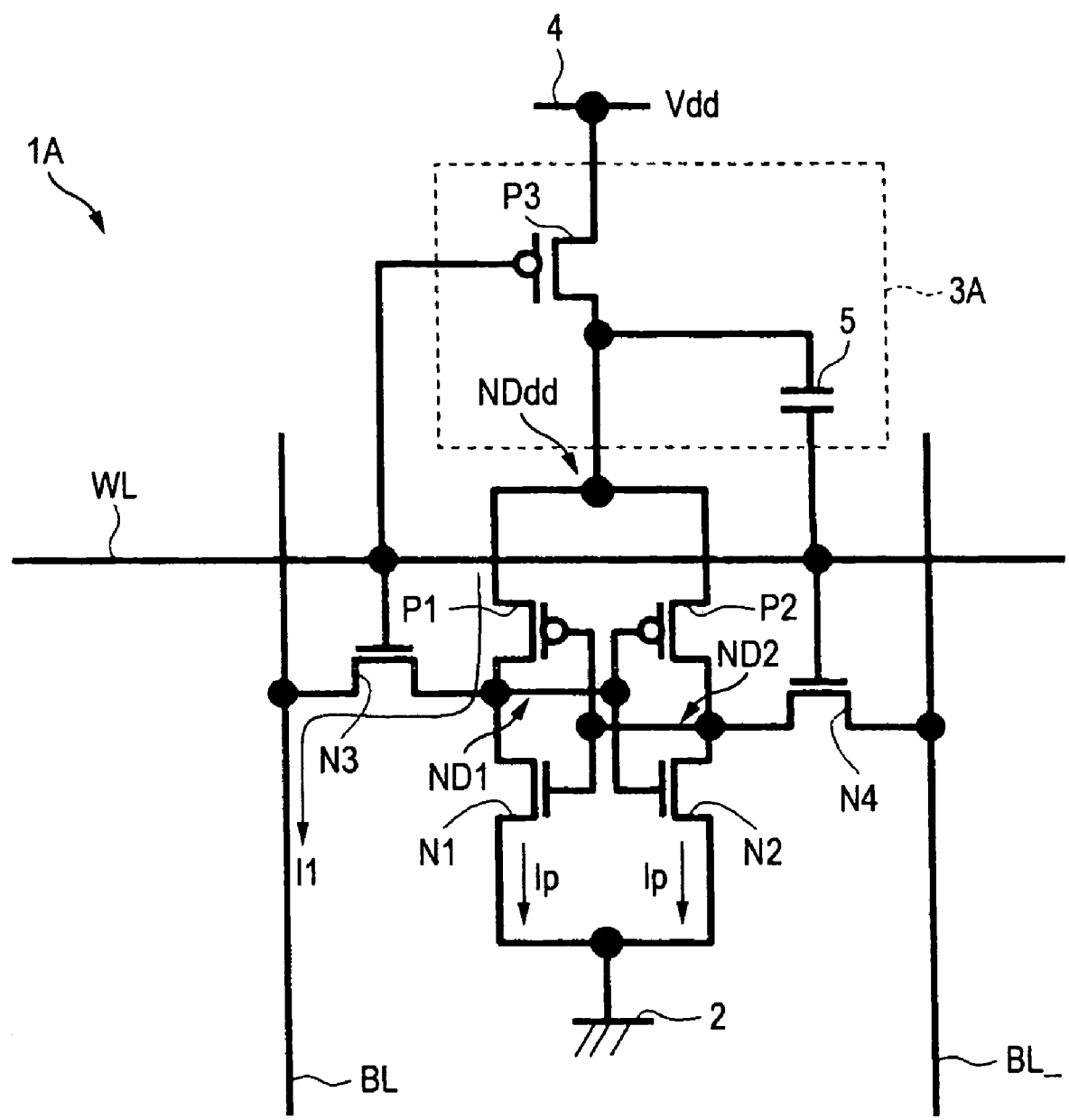
FIG. 1 shows a circuit diagram depicting a cell according to a first embodiment.

FIG. 1 shows a circuit diagram depicting a PMOS load SRAM cell according to a first embodiment of the invention.

Figure 23:
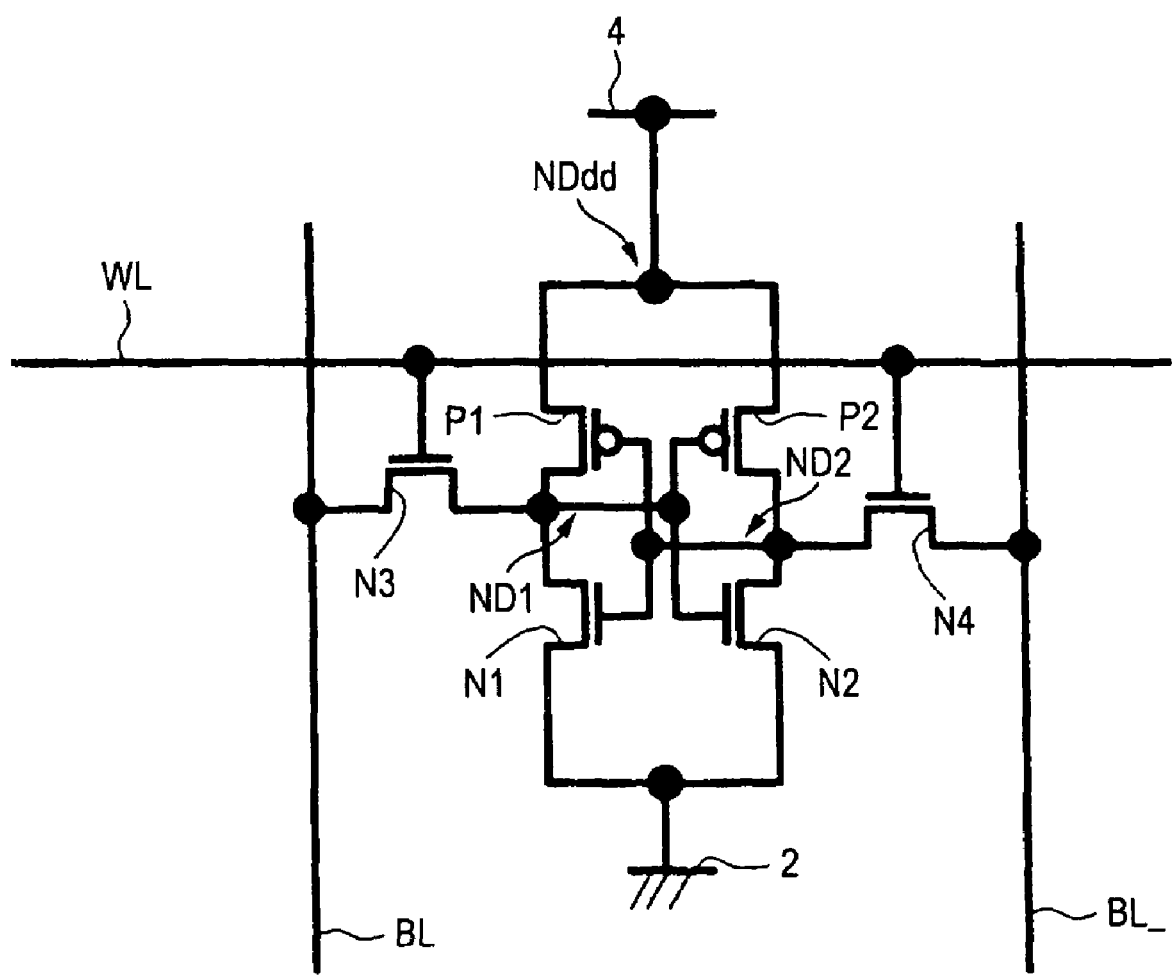
FIG. 23 shows a circuit diagram depicting a typical six transistor cell.
Figure 24B:
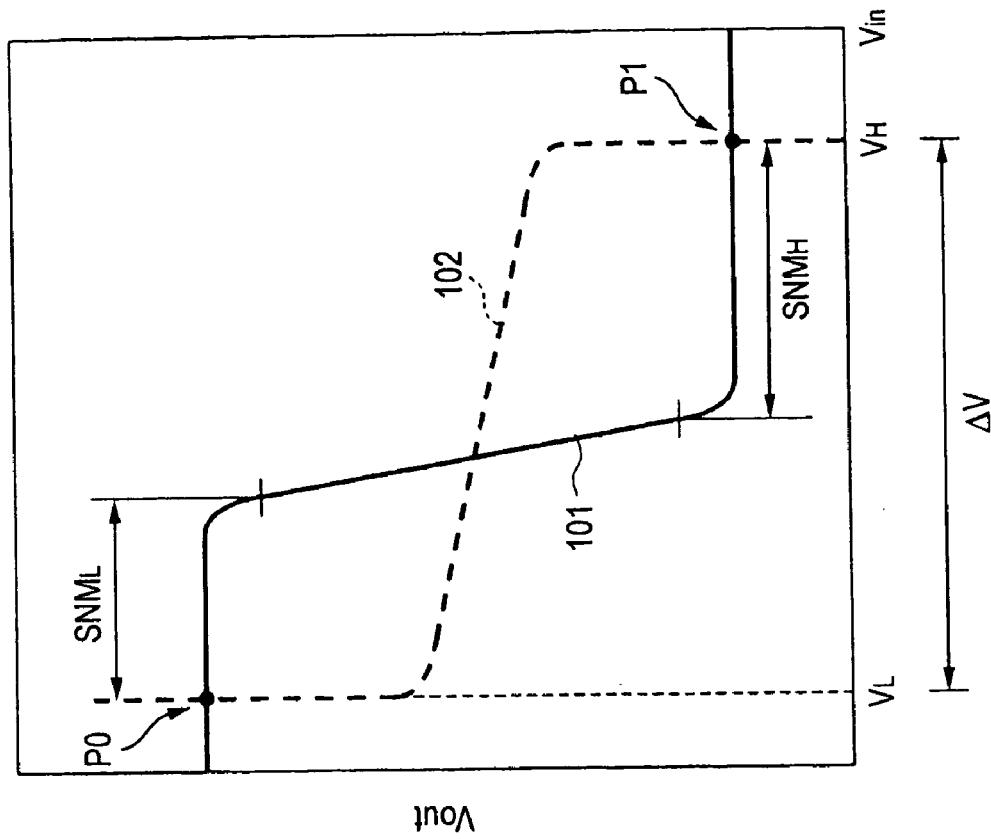
FIGS. 24A and 24B show illustrations depicting inverter characteristics.
Figure 24A:
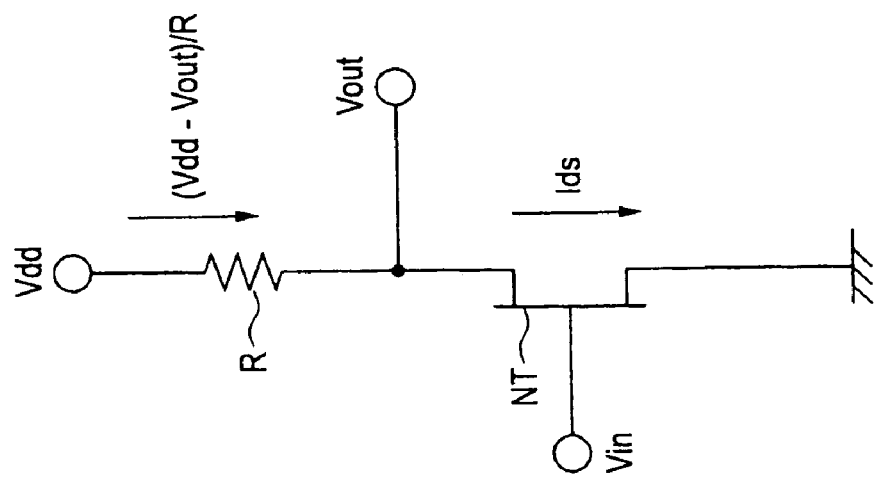
Figure 25:
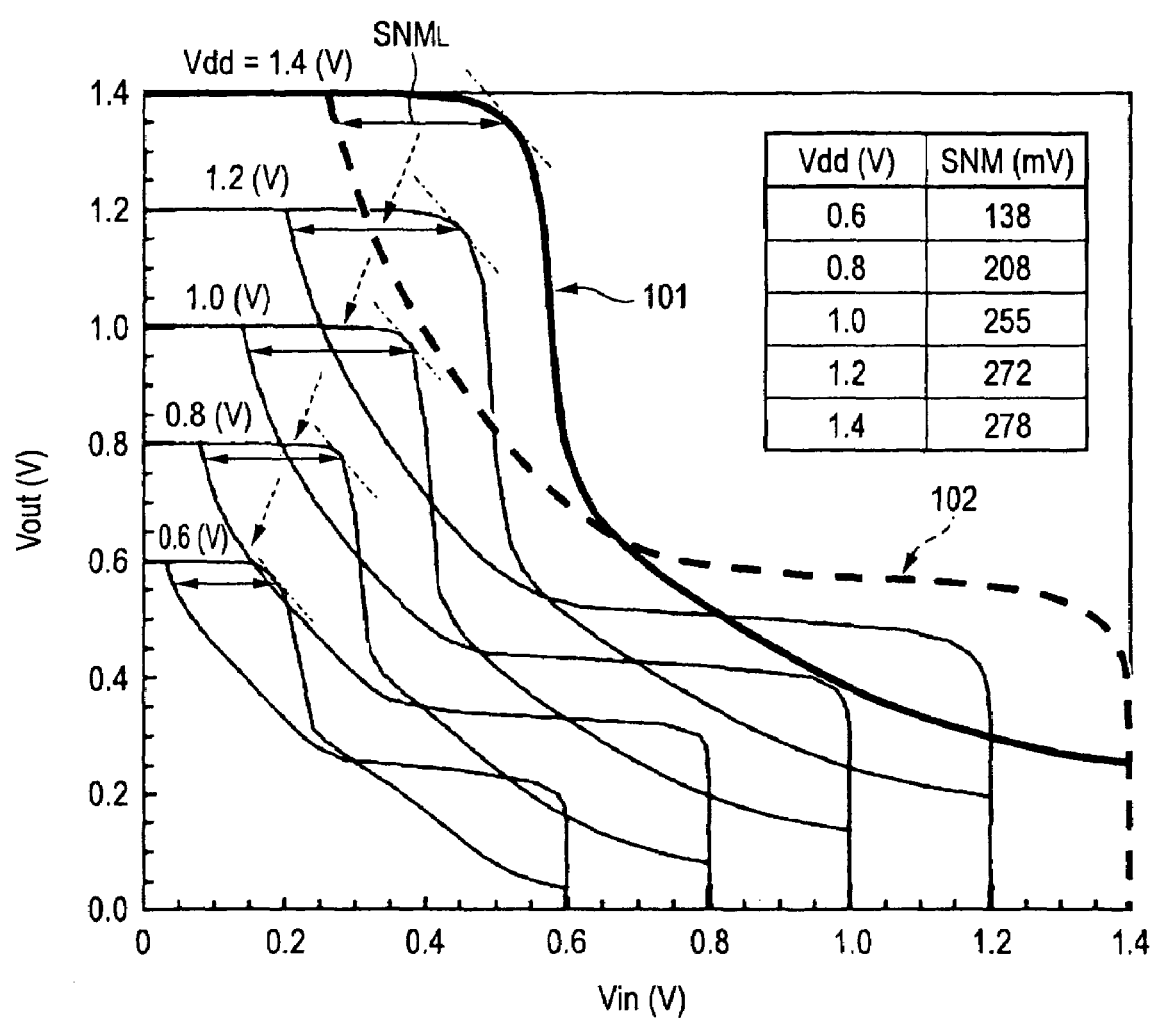
FIG. 25 shows a graph depicting the butterfly characteristics of the SRAM cell.
Figure 26A:
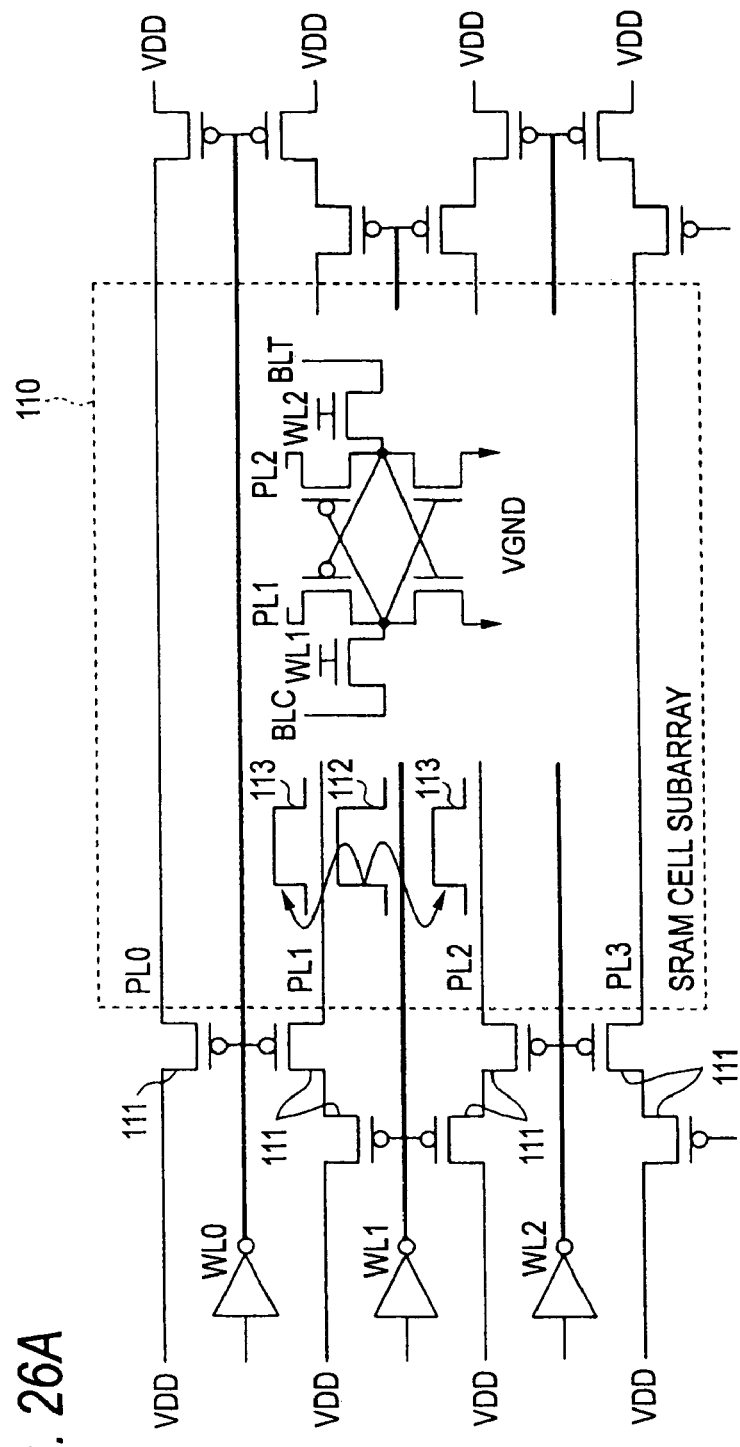
FIGS. 26A and 26B show a circuit diagrams depicting and a circuit diagram depicted in Non-Patent Reference 2.
Figure 26B:
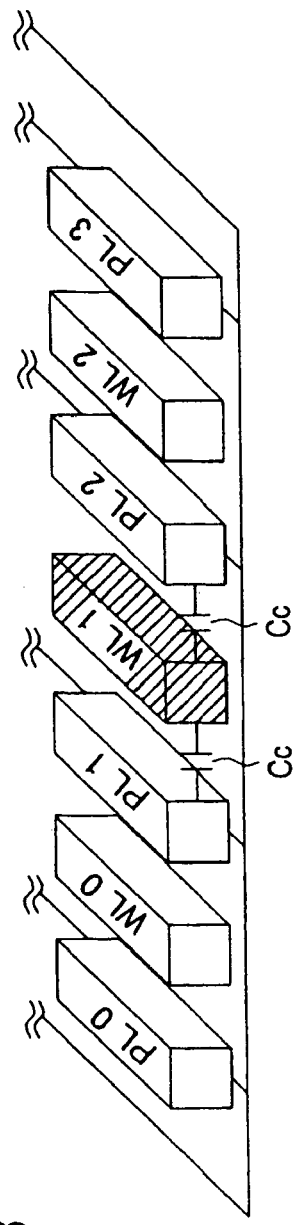
Figure 27B:
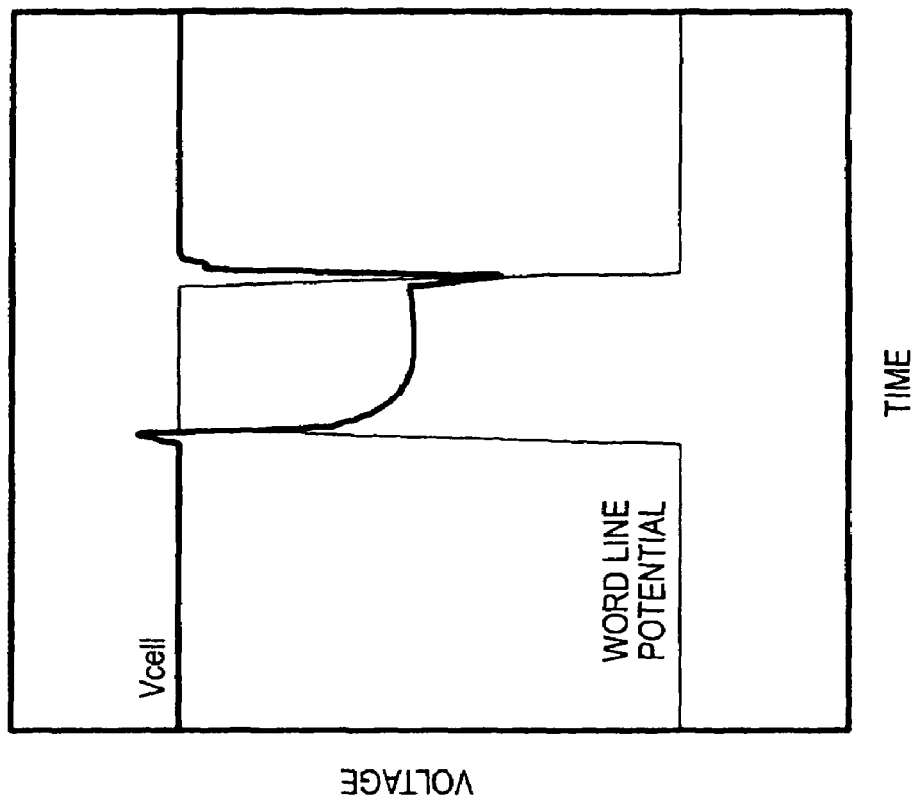
FIGS. 27A and 27B show graphs depicting the relation between the combined capacitance and the cell voltage.
Figure 27A:
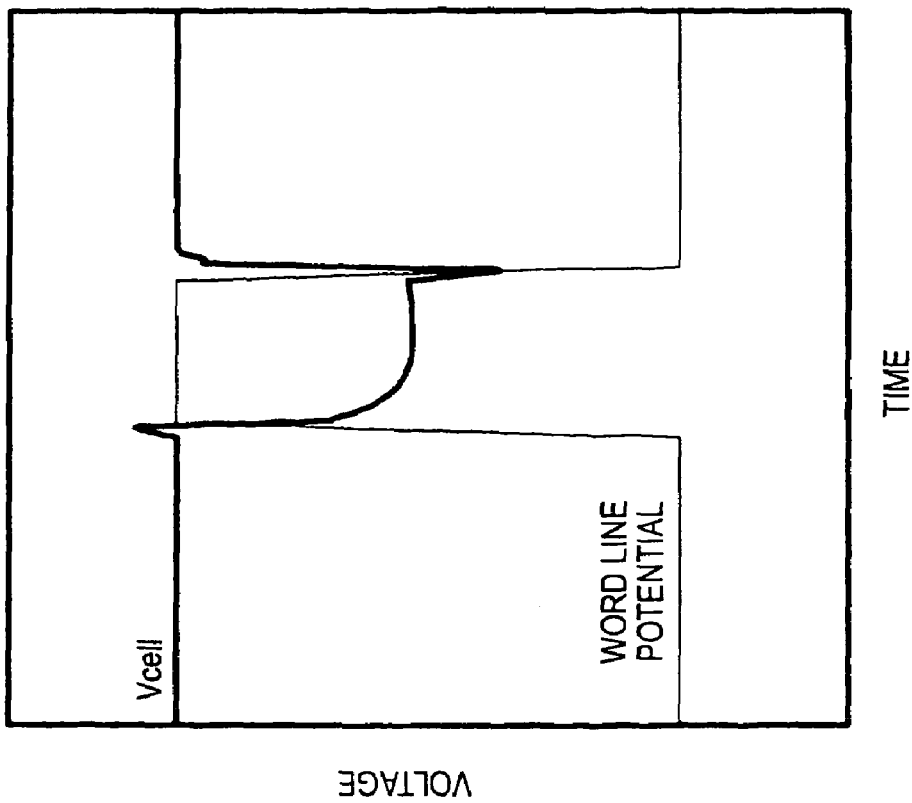
Figure 28A:
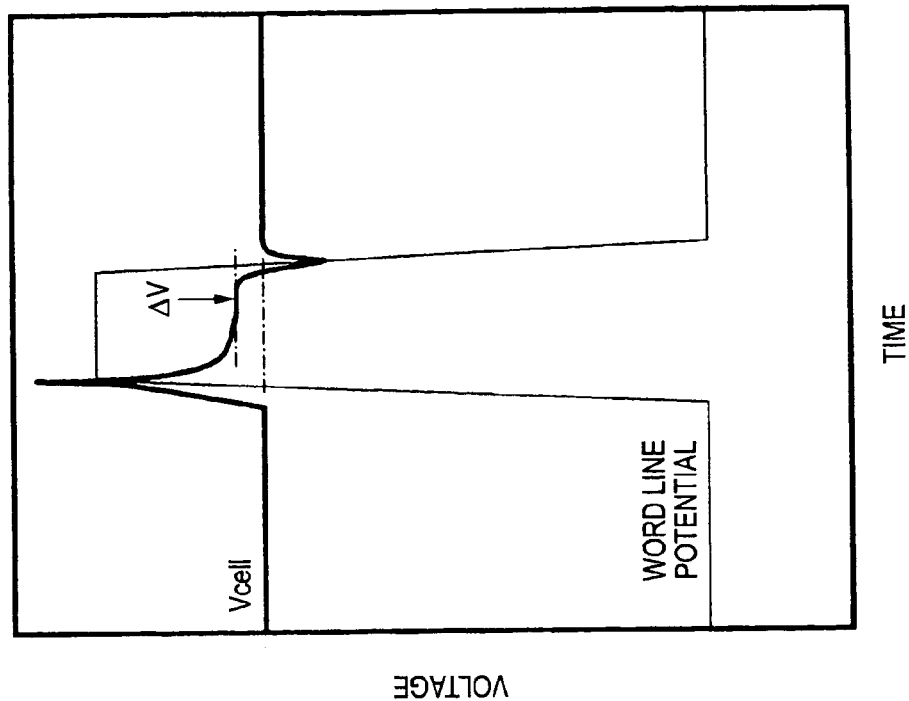
FIGS. 28A and 28B show graphs depicting another relation between the combined capacitance and the cell voltage.
Figure 28B:
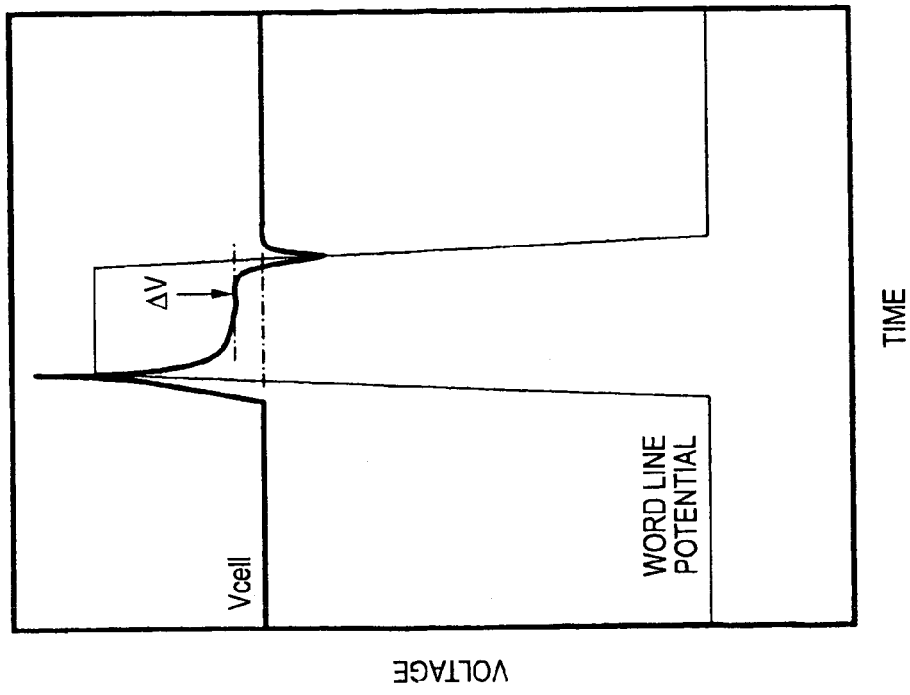

The SRAM cell 1A has the similar configuration as that of the typical six transistor SRAM cell, including two load transistors P1 and P2 formed of a P-channel MOS transistor (PMOS), two driver transistors N1 and N2 formed of an N-channel MOS transistor (NMOS), and two transfer transistors N3 and N4 formed of an NMOS. The relation of connection of a power supply node NDdd and a supply line 2 for the reference voltage and a pair of bit lines BL and BL_ for these devices is the same as that shown in FIG. 23, omitting the overlapping descriptions.

The SRAM cell 1A according to the embodiment has a voltage booster circuit 3A for every cell.

For example, as shown in FIG. 1, the voltage booster circuit 3A has a feed control transistor P3 formed of a single PMOS as a feed control switch. In the feed control transistor P3, the source is connected to a supply line 4 at the power supply voltage Vdd, the drain is connected to the power supply node NDdd in the cell, and the gate is connected to a word line WL.

The voltage booster circuit 3A has a capacitor 5 as a boosting device between the word line WL and the power supply node NDdd.

Next, the operation of the SRAM cell 1A will be described briefly in standby, data read, and data write separately.

During standby, the additional feed control transistor P3 is in an ON state, and the power supply voltage Vdd is supplied to the power supply node NDdd to hold data in the same state as the SRAM in the typical six transistor configuration.

In data write, the following operation is conducted. First, the basic operation of the SRAM cell 1A in data write will be described.

In the SRAM cell 1A, in data write, a predetermined voltage is applied to the gates of the transfer transistors N3 and N4 through the word line WL to turn on two transfer transistors N3 and N4 to store electric charge in the storage nodes ND1 and ND2 as the bit line BL1 is maintained at the high potential or the low potential. The driver transistors N1 and N2 and the load transistors P1 and P2 are operated so that when one of the storage nodes is turned "high (H)", the other storage node is turned "low (L)". For example, when the storage node ND1 is "H" and the storage node ND2 is "L", the transistors N2 and P1 are turned to the ON state, the transistors N1 and P2 are turned to the OFF state, electric charge is supplied to the storage node ND1 from the power supply node NDdd, and the storage node ND2 is kept at the ground potential. In reverse, the transfer transistor N3 is turned on when the bit line BL potential is "L", whereby the storage node ND1 is forcedly shifted "L", or the transfer transistor N4 is turned on when the bit complementary line BL_potential is "H", whereby the storage node ND2 is forcedly shifted "H. Thus, the transistors N1, N2, P1 and P2 are all reversely operated, electric charge is supplied to the storage node ND2 from the supply line of the power supply voltage Vdd, and the storage node ND1 is held at the ground potential. In this manner, electric charge is held by flip flop operation, whereby electric charge is statically held in the storage nodes ND1 and ND2, in which data representing whether the potential is "L" or "H" can be stored in six transistors in the cell as the data is associated with data "0" and "1".

In the write operation, the voltage booster circuit 3A is operated as follows.

When the word line WL is turned "H", the feed control transistor P3 is changed from the ON state to the OFF state. Therefore, the feed control transistor P3 is cut off, and the power supply node NDdd is electrically isolated from the Vdd supply line 4. In addition, rising the word line voltage increases the voltage (cell voltage Vcell) of the power supply node NDdd through the capacitor 5.

In the write operation, it is determined whether data held in the storage nodes ND1 and ND2 is inverted or not depending on the stored data in the SRAM cell 1A at the previous stage.

Figure 2B:
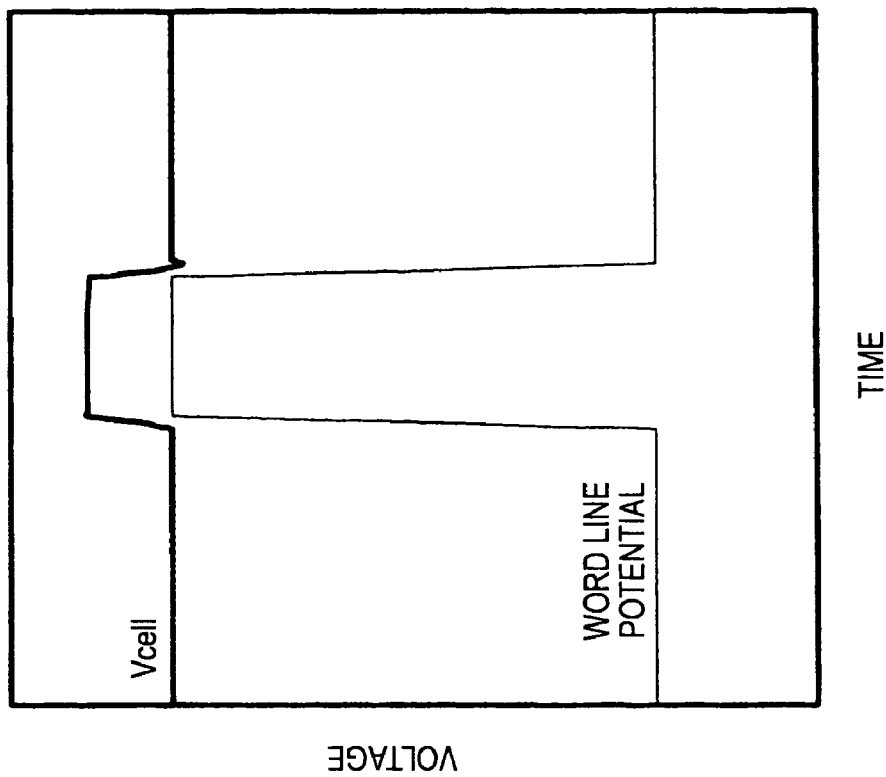
FIGS. 2A and 2B show diagrams depicting the simulation results for determining the relation between the cell voltage and the WL potential.
Figure 2A:
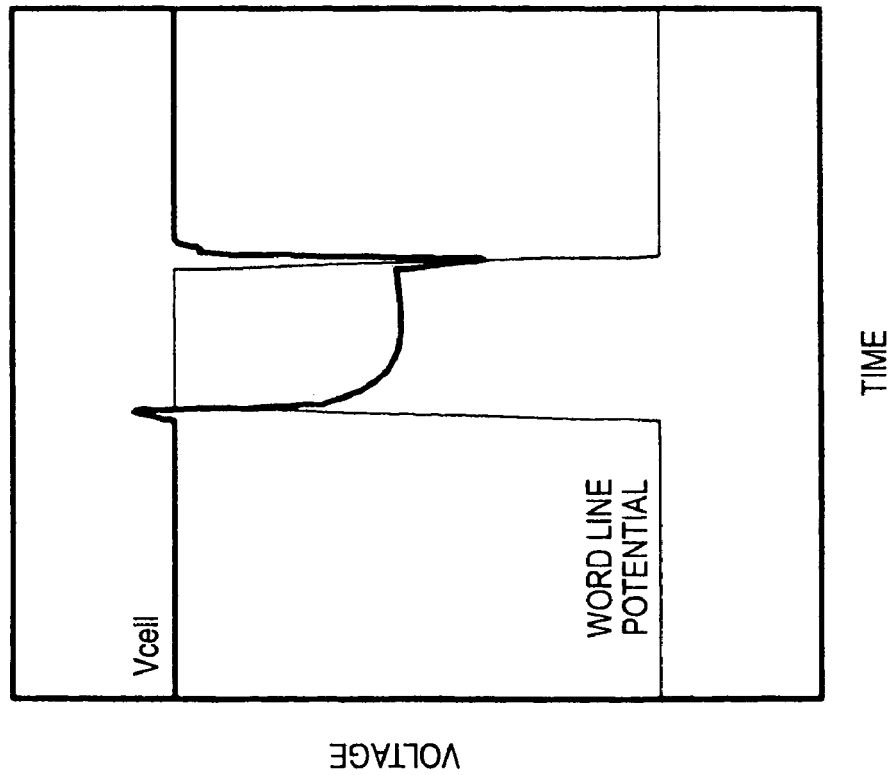

When data is inverted, current flows into the bit line BL through the transfer transistor N3 in addition to the penetration current Ip at the time when the storage node ND1 shown in FIG. 1, for example, is turned from "H" (power supply voltage Vdd level) to "L" (GND level). Therefore, as shown in FIG. 2A, the cell voltage Vcell suddenly drops. At this time, the supply path of electric charge is cut off because the feed control transistor P3 is turned off. Thus, while the voltage of the word line WL is maintained at high level, the cell voltage Vcell maintains the voltage lower than the initial value.

The drop in the cell voltage Vcell like this has an effect of facilitating bit inversion. More specifically, generally in the flip flop circuit, the operation becomes more unstable in the state that tends to change than the state in which the power supply voltage is fixed. Then, in the flip flop circuit, the state of unstable operation tends to generate data in version. From the reason similar to this, when the cell voltage Vcell of the rewrite cell drops as shown FIG. 2A, data inversion (data rewrite operation) can be surely conducted even though the operating voltage is decreased.

On the other hand, the non-rewrite cell connected to the same word line WL is operated to read data as described above. When data is read out of the non-rewrite cell, such a state is kept that the pair of the bit lines BL and BL_ is floated "H" (power supply voltage Vdd). Thus, when the voltage of the word line WL rises, the voltage drops in the bit line BL or the bit complementary line BL_ on the "HH" side of the storage node. The voltage level after the voltage drop of the bit line is logically inverted by a buffer, not shown, connected to the pair of the bit lines BL and BL_, and then data is rewritten to the cell.

In this data read, electric charge sometimes flows into one of the S driver transistors N1 and N2 from the bit line BL or the bit complementary line BL_, but bit inversion carrying the penetration current does not occur when the cell voltage Vcell is sufficiently high. Therefore, as shown in FIG. 2B, the voltage of the cell voltage Vcell maintains the level boosted by the capacitor 5. Thus, current is quickly carried in or out from the pair of the bit lines BL and BL_ through the transfer transistors N3 and N4, leading to accelerating a bit line change rate. Consequently, high speed data read is allowed.

The value of the capacitor 5 in the circuit shown in FIG. 1 is optimized in accordance with the boosting target from the initial value of the cell voltage Vcell depending on the power supply voltage Vdd.

Here, suppose the value of capacitance added to the power supply node NDdd when P3 is in the OFF state (the sum of the initial capacity value of the capacitor 5 and the parasitic capacitance of the node) is "C", and the value of capacitance added to the power supply node NDdd after boosted is "C+α".

When the combined capacitance α and the initial voltage Vwl of the word line WL in data write or data read are used to express the cell voltage Vcell after boosted, it is Equation (1-1) below. In addition, Equation (1-2) is obtained where the initial voltage Vwl of the word line is the power supply voltage Vdd.

$$V\text{cell} = Vdd + \{/(1+\alpha)\}Vwl \quad (1\text{-}1)$$

$$V\text{cell} = \{1+\alpha/(1+\alpha)\}Vdd \quad (1\text{-}2)$$

Figure 3:
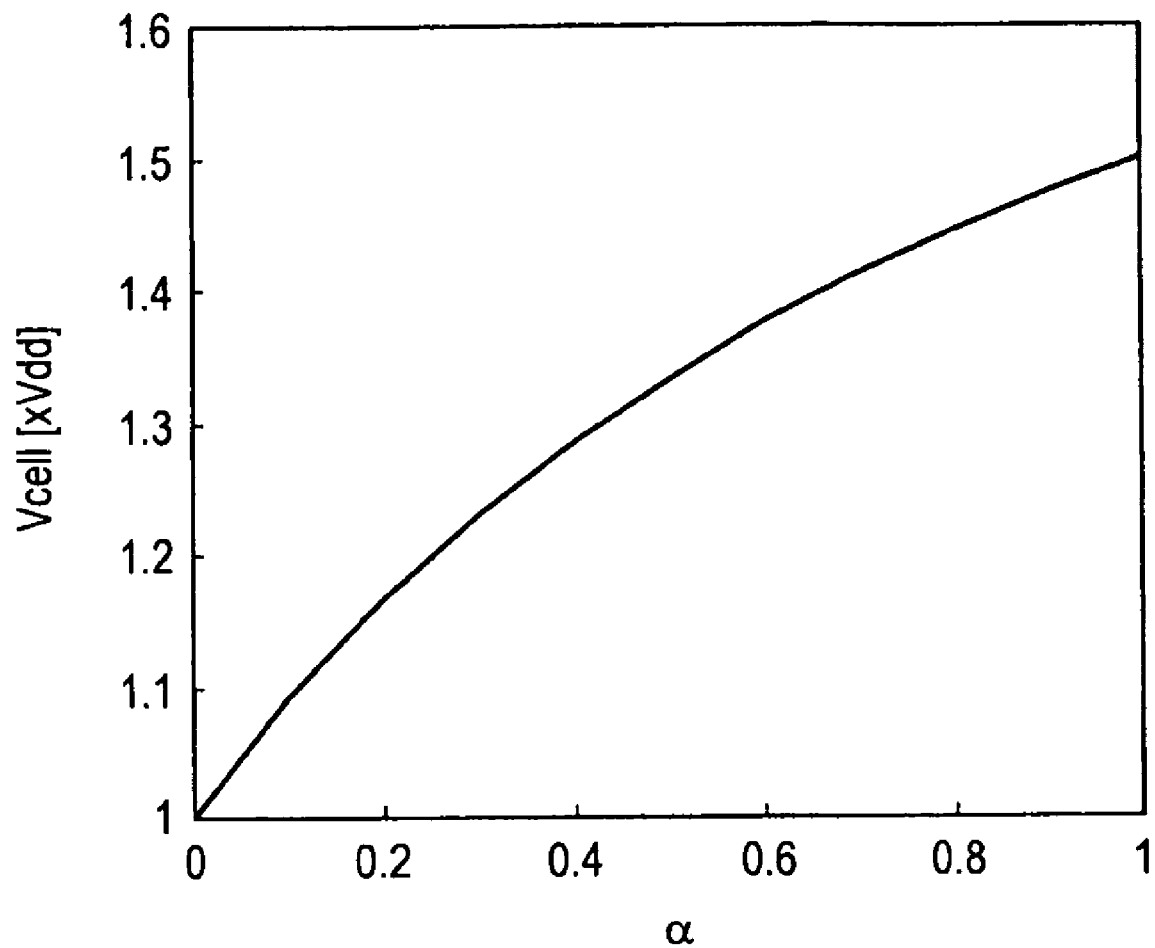
FIG. 3 shows a graph depicting the relation between the combined capacitance and the cell voltage.

FIG. 3 shows the relation between the combined capacitance α and the cell voltage Vcell (pressure up coefficient) normalized by the power supply voltage Vdd.

The capacitance value of the capacitor 5 is increased to grow the combined capacitance α, whereby the cell voltage Vcell can be boosted to higher voltage.

FIGS. 4 to 8 show exemplary layouts of the SRAM cell 1A under fabrication.

Figure 4:
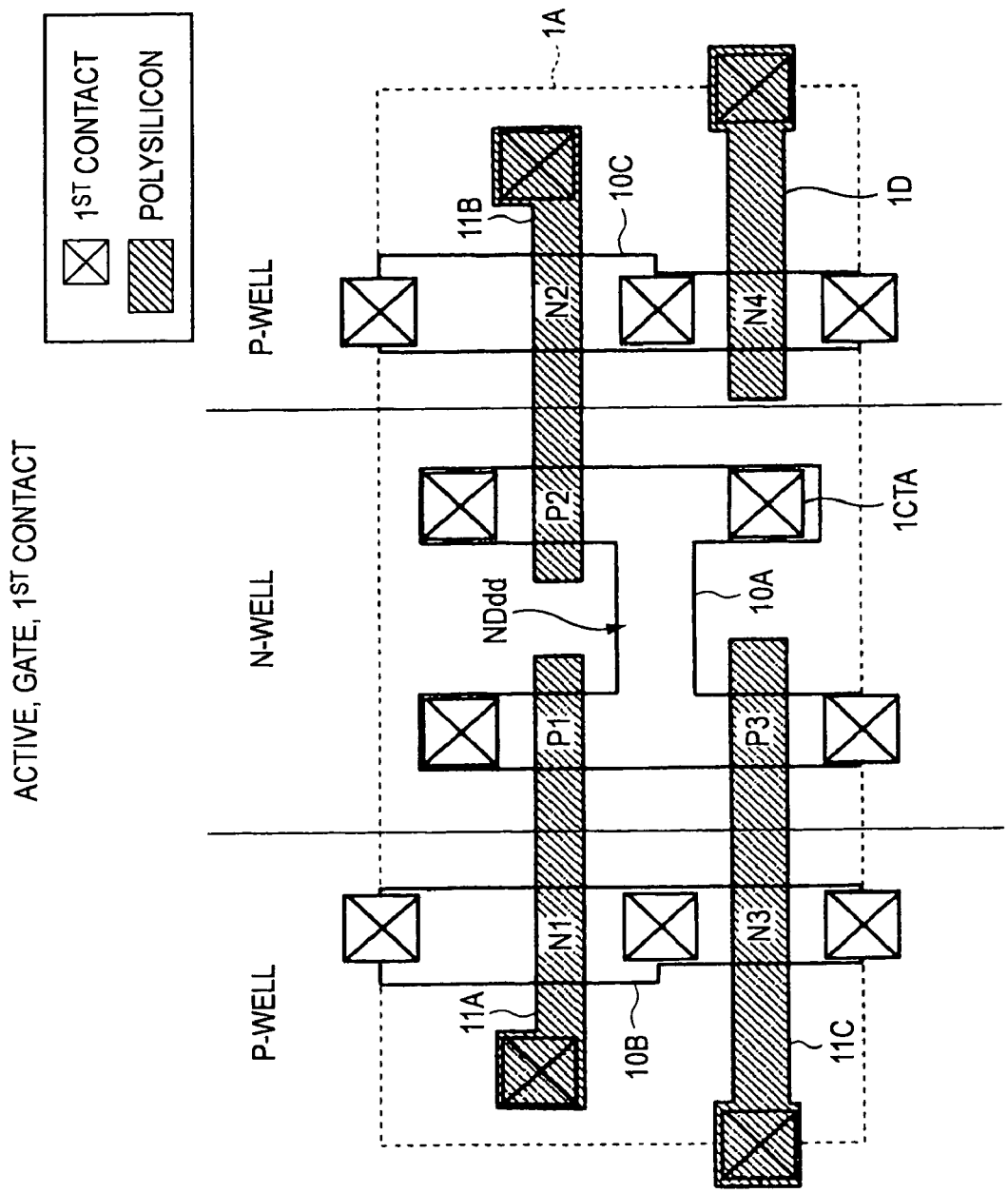
FIG. 4 shows a cell layout diagram after polysilicon is formed in regard to the first embodiment.

In FIG. 4, a P-well and an N-well are formed on a semiconductor substrate, and active areas 10A, 10B and 10C that are surrounded by a device separation insulating layer are arranged in the P-well and N-well. The active area 10A has N conductive type, and is used for forming the load transistors P1 and P2 and the feed control transistor P3 added in the embodiment. The active area 10B has P conductive type, and is used for forming the driver transistor N1 and the transfer transistor N3. The active area 10C is has P conductive type, and used for forming the driver transistor N2 and the transfer transistor N4.

A common gate wiring 11A formed of polysilicon for the first inverter is arranged as it crosses the active areas 10B and 10A. Similarly, a common gate wiring 11B formed of polysilicon for the second inverter is arranged as it crosses the active areas 10C and 10A. In addition, a common gate wiring 11C formed of polysilicon for the transfer transistor N3 and the feed control transistor P3 is arranged as it crosses the active areas 10B and 10A. Furthermore, a gate wiring 11D of the transfer transistor N4 is arranged as it crosses the active area 10C.

An N-type impurity or a P-type impurity is ion injected into the portions of the active areas 10A, 10B and 10C not overlapping with polysilicon to form the source/drain area of each of the transistors (symbols and numerals are omitted).

A first interlayer insulating film (not shown) is deposited, and a first contact is formed on the impurity area formed on the active areas 10A, 10B and 10C.

Figure 5:
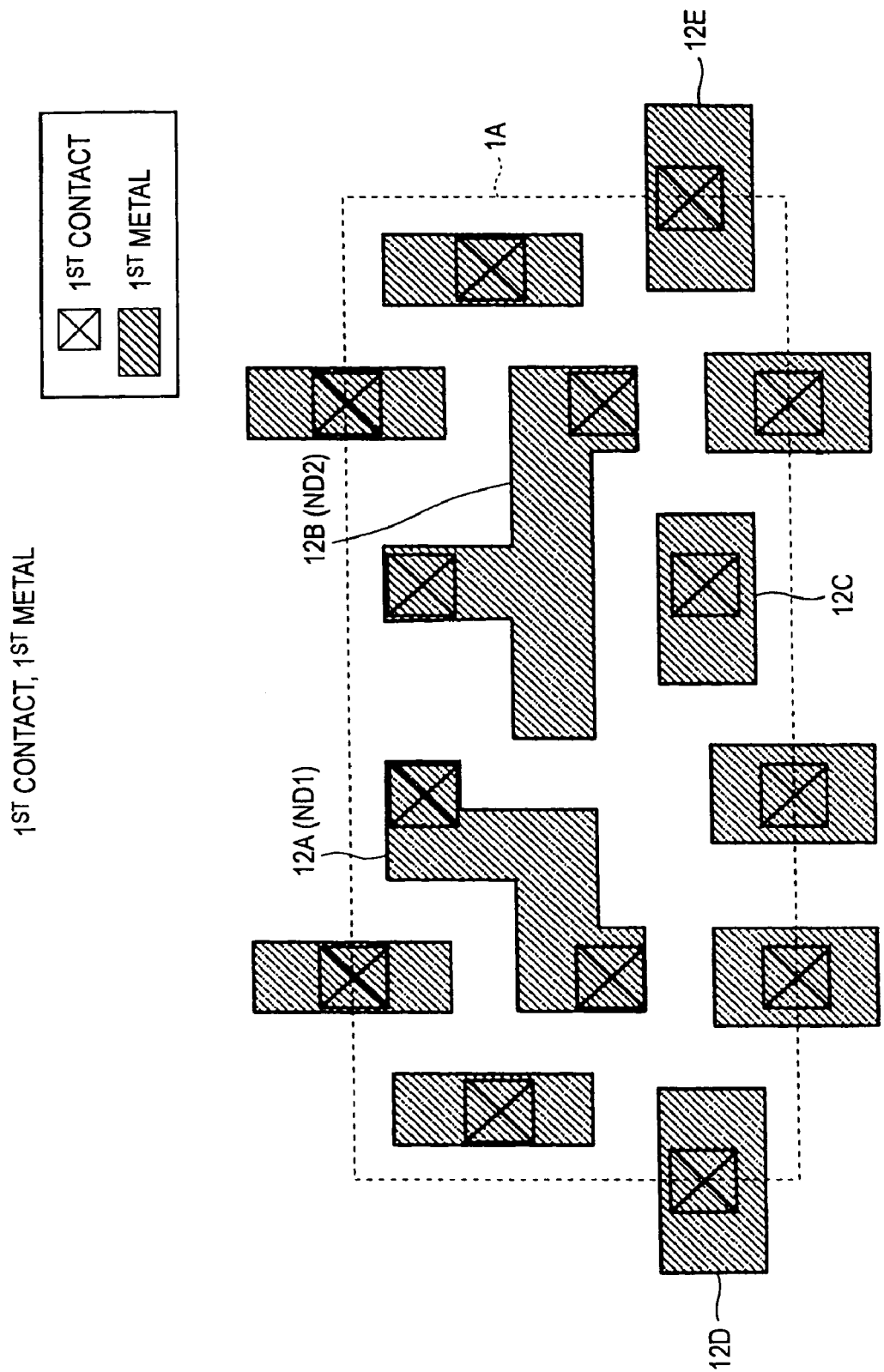
FIG. 5 shows a cell layout diagram after a first metal is wired in regard to the first embodiment.

FIG. 5 shows a layout diagram after a wiring connecting between the first contacts and a landing pad layer for an uppermost layer contact are formed by a first metal.

When FIG. 5 is compared with FIG. 4, a wiring 12A connects the contact of the connecting node of the driver transistor N1 and the transfer transistor N3 to the drain contact of the load transistor P1. Since the wiring forms the storage node ND1, hereinafter, it is referred to as a first storage node wiring 12A.

Similarly, a wiring 12B connects the contact of the connecting node of the driver transistor N2 and the transfer transistor N4 to the drain contact of the load transistor P2. Since the wiring 12B forms the storage node ND1, hereinafter, it is referred to as a second storage node wiring 12B.

A landing pad layer 12C is connected to the source/drain region (the power supply node NDdd) which functions as the drain of the feed control transistor P3 and the sources of the load transistors P1 and P2 shown in FIG. 4 through the first contact. The landing pad layer 12C is a layer which connects the power supply node NDdd to the wiring in the upper layer (one electrode of the capacitor 5).

Landing pad layers 12D and 12E are connected to the common gate line 11C and the gate wiring 11D shown in FIG. 4, respectively, through the first contact. The landing pad layer 12D is a layer which connects the transfer transistor N3 and the gate of the feed control transistor P3 to the wiring in the upper layer (the other electrode of the capacitor 5). Similarly, the landing pad layer 12E is a layer which connects the gate of the transfer transistor N4 to the other electrode of the capacitor 5.

Figure 6:
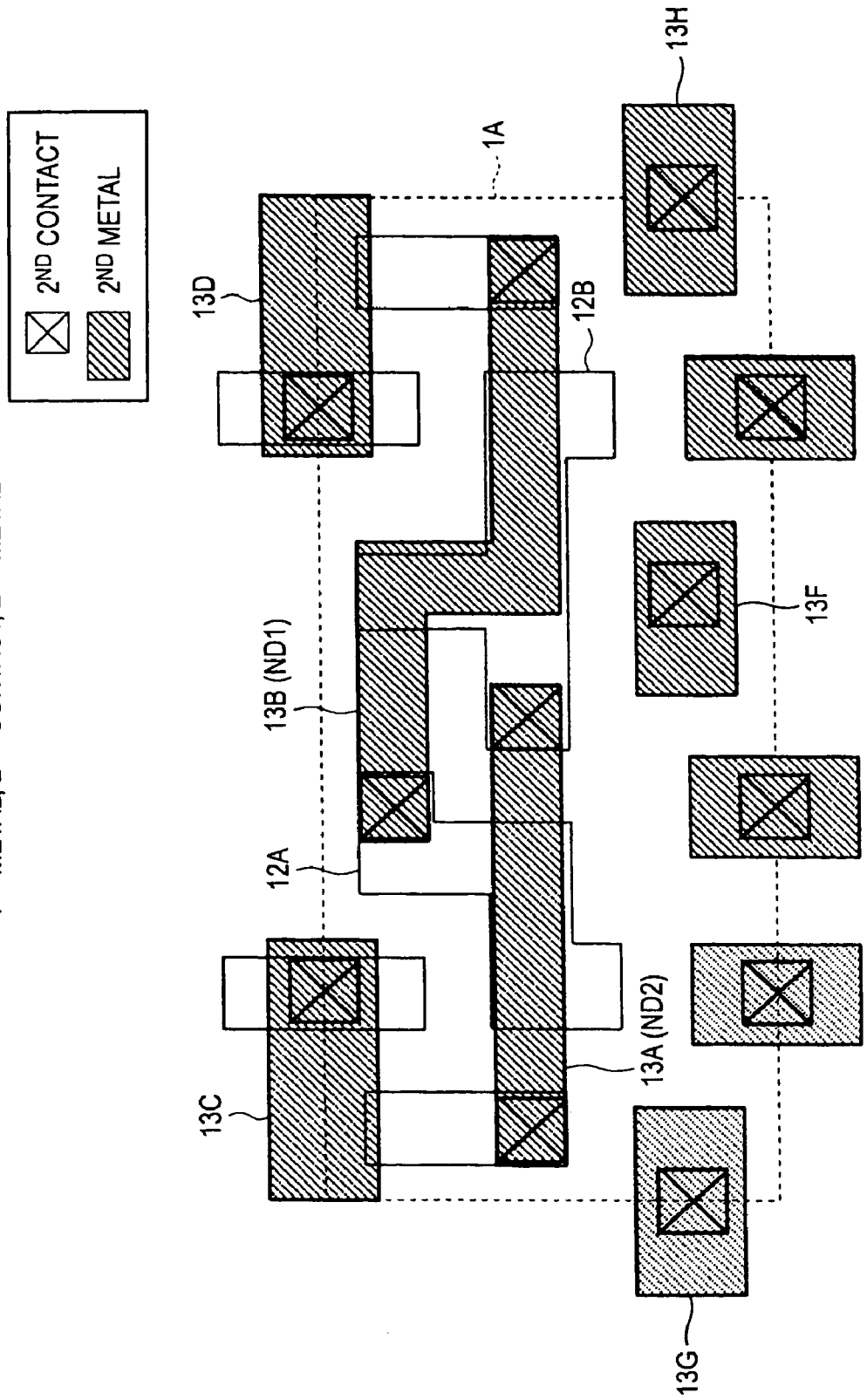
FIG. 6 shows a cell layout diagram after a second metal is wired in regard to the first embodiment.

In FIG. 6, a second interlayer insulating film (not shown) is deposited, a second contact is formed thereon, and internal connecting lines 13A, 13B, 13C and 13D are formed thereon by a second metal.

The internal connecting line 13A is a wiring which connects the second storage node wiring 12B to the driver transistor N1 and to the common gate wiring 11A of the load transistor P1. The internal connecting line 13B is a wiring which connects the first storage node wiring 12A to the driver transistor N2 and to the common gate wiring 11B of the load transistor P2.

In addition, the internal connecting lines 13C and 13D are wirings which are short circuit wirings for the second contact and the contact in the uppermost layer.

For the other contacts, the landing pad layer is formed by the second metal.

Among them, a landing pad layer 13F is connected to the landing pad layer 12C shown in FIG. 5 through the second contact. Similarly, a landing pad layer 13G is connected to the landing pad layer 12D shown in FIG. 5 through the second contact. In addition, a landing pad layer 13H is connected to the landing pad layer 12E shown in FIG. 5 through the second contact.

Figure 7:
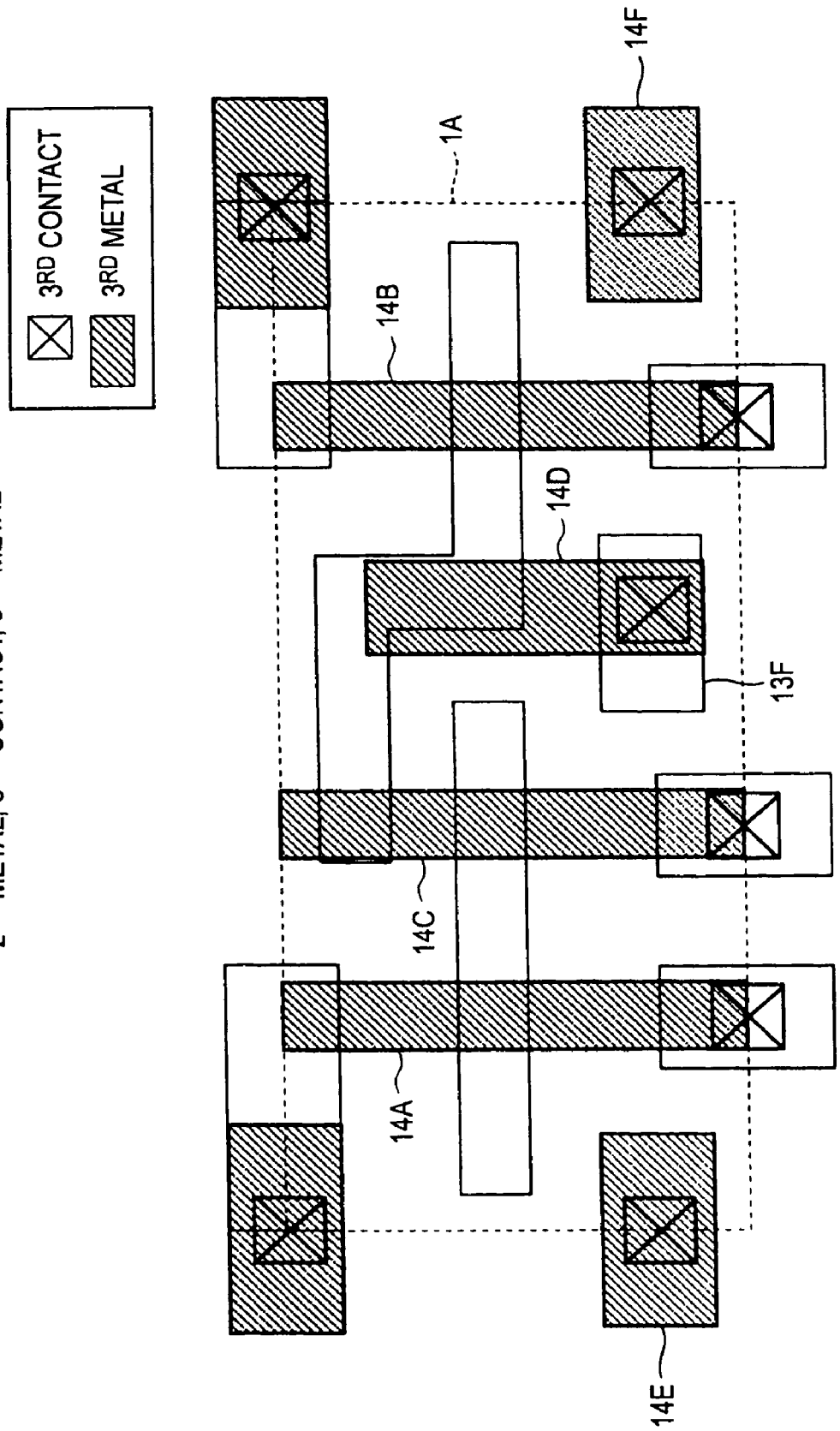
FIG. 7 shows a cell layout diagram after a third metal is wired in regard to the first embodiment.

In FIG. 7, a third interlayer insulating film (not shown) is deposited, a third contact is formed thereon, and internal wiring layers 14A, 14B, 14C, 14D and landing pad layers are formed thereon by a third metal.

Although detailed descriptions are omitted, the internal wiring layers 14A, 14B, 14C and 14D are wirings which connect the bit line BL, the bit complementary line BL_ or the word line WL in the uppermost layer to each of the transistors.

In addition, a landing pad layer formed by the third metal at four corners of the SRAM cell 1A is formed to connect the gates of the transfer transistors N3 and N4 to the electrode wiring of the capacitor 5 in the uppermost layer, or to connect the sources of the driver transistors N1 and N2 to the supply line 2 at the reference voltage in the uppermost layer.

Among them, in order to form a connection path to the electrode of the capacitor 5 formed on the upper layer, a landing pad layer 14E is connected to the landing pad layer 13G shown in FIG. 6 through the third contact. Similarly, a landing pad layer 14F is connected to the landing pad layer 13H shown in FIG. 6 through the third contact.

Figure 8:
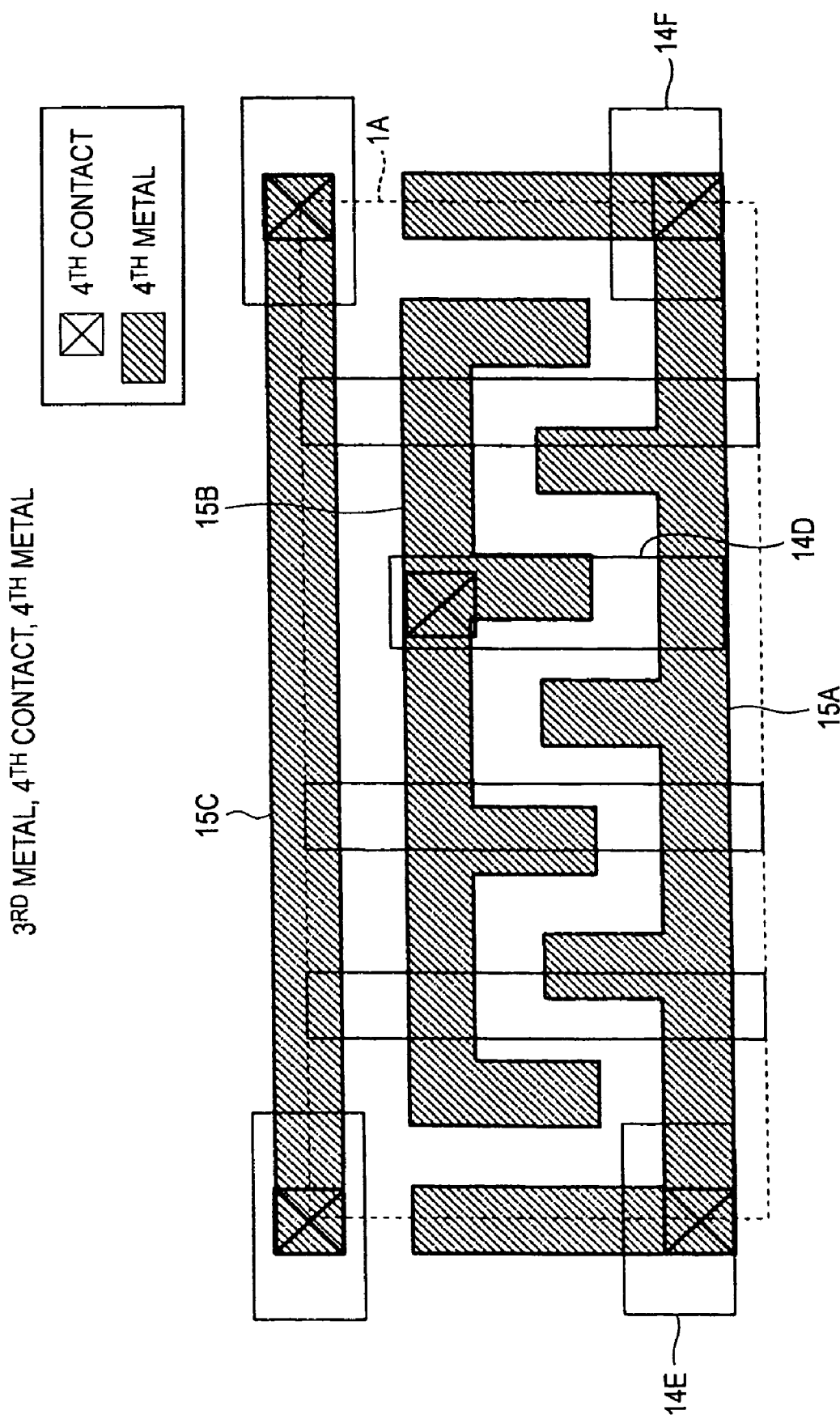
FIG. 8 shows a cell layout diagram after a fourth metal is wired in regard to the first embodiment.

In FIG. 8, a fourth interlayer insulating film (not shown) is deposited, a fourth contact is formed thereon, and an electrode layer 15A and an electrode layer 15B of the capacitor 5 and a GND internal wiring layer 15C are formed thereon by a fourth metal.

The electrode layer 15A of the capacitor 5 is connected to the landing pad layer 14E shown in FIG. 7 through the fourth contact, and connected to the landing pad layer 14F shown in FIG. 7 through another fourth contact. When seen from FIG. 4 to FIG. 8, it is reveled that the electrode layer 15A of the capacitor 5 is connected to the common gate line 11C of the transfer transistor N3 and the feed control transistor P3 as well as connected to the gate wiring 11D of the transfer transistor N4 shown in FIG. 4.

On the other hand, the electrode layer 15B of the capacitor 5 shown in FIG. 8 is connected to the internal wiring layer 14D and to the landing pad layer 13F thereunder shown in FIG. 7 through the fourth contact. Furthermore, when seen from FIG. 4 to FIG. 8, it is reveled that the electrode layer 15B of the capacitor 5 is connected to the power supply node NDdd shown in FIG. 4. Not shown in particularly, the pair of the bit lines BL and BL_ and the word line WL are formed by the wiring layer in the uppermost layer.

As shown in FIG. 8, in the SRAM cell 1A, the capacitor 5 is formed of the electrode layer 15A and the electrode layer 15B formed by the fourth metal and an insulator buried between two side walls. The structure has an advantage that the wiring structure for forming the capacitor is not multilayered.

In addition, according to an embodiment of the invention the capacitor structure to boost the cell voltage Vcell (power supply node NDdd) has no limitations, any of the following may be applied: an MIM capacitor formed of two layers of wirings and an insulating film therebetween (interlayer insulating film or a high dielectric film specially formed), an MIS capacitance in which the impurity area of the semiconductor substrate is one of the electrodes, or an MIS capacitance described in a second embodiment below.

SECOND EMBODIMENT

Figure 9:
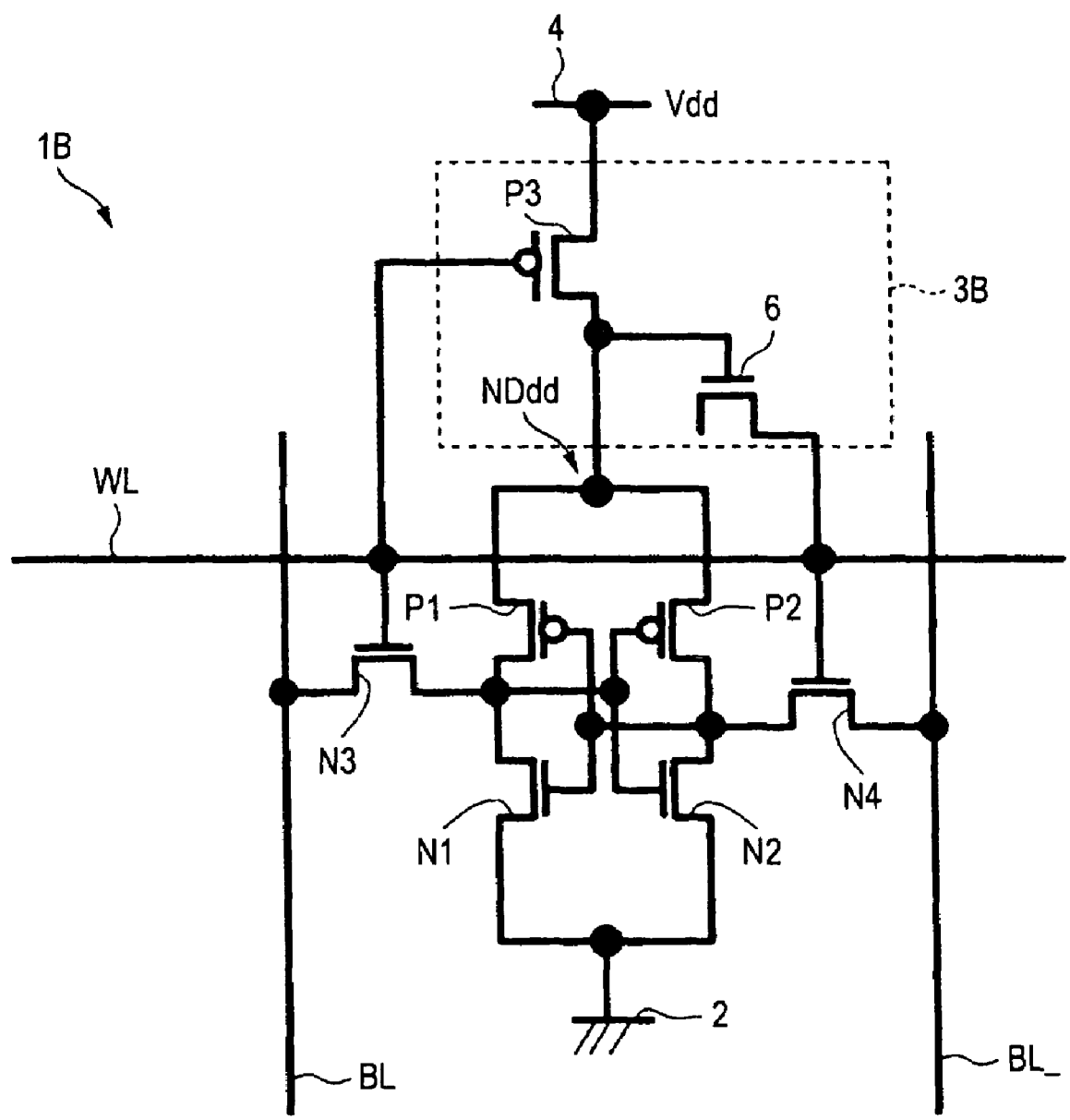
FIG. 9 shows a circuit diagram depicting a cell according to a second embodiment.

FIG. 9 shows a cell circuit (SRAM cell) 1B according to a second embodiment.

In the circuit, the capacitor 5 of the voltage booster circuit 3B (FIG. 1) is replaced by an MIS capacitance 6.

In the MIS capacitance 6, the gate is connected to the power supply node NDdd, one of the source and the drain is connected to a word line WL, and the other remains open. In addition, the MIS capacitance 6 may be one in which both of the source and the drain are connected to the word line WL.

The operation of the circuit is the same as that of the first embodiment, but in the MIS capacitance 6 of one side open, the capacitance value is changed before and after the word line WL is boosted, and it can be boosted to higher voltage. Hereinafter, this point will be described.

Figure 10A:
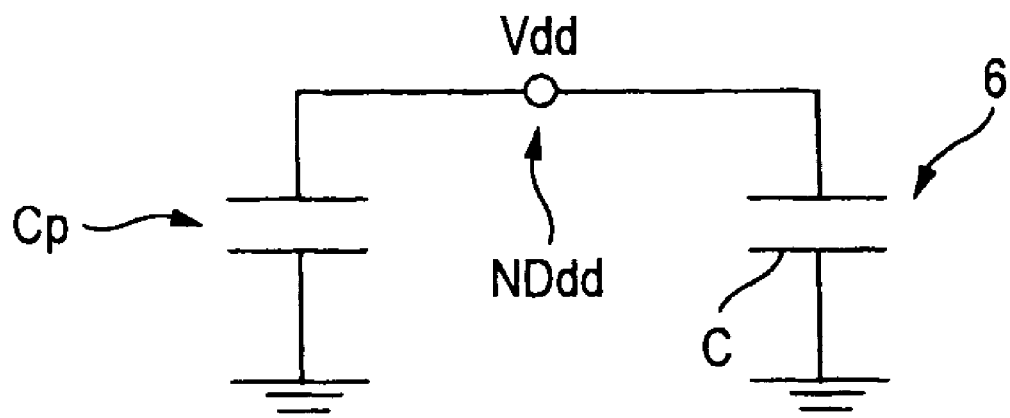
FIGS. 10A and 10B show diagrams depicting the combined capacitance relation between an initial state and a boosted state.
Figure 10B:
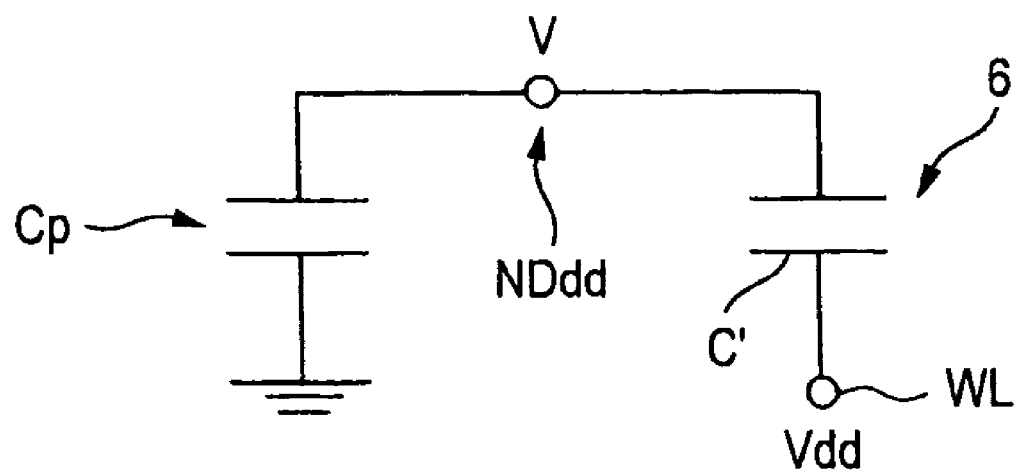

FIGS. 10A and 10B show the relation of the combined capacitance between the initial state and the boosted state.

In the initial state (FIG. 10A) before boosted, the potential of the power supply node NDdd is the power supply voltage Vdd, and a parasitic capacitance Cp and a value C of the MIS capacitance 6 before capacitance change are connected in parallel between the power supply node NDdd and the ground potential.

When pressure is increased in this state, one electrode (the word line WL) of the MIS capacitance 6 is the power supply voltage Vdd. Thus, the capacitance value of the MIS capacitance 6 is changed from C to C'.

An electric charge Q of the power supply node NDdd before boosted is expressed by Equation (2-1) below, and an electric charge Q' of the power supply node NDdd after boosted is expressed by Equation (2-2) below by using a boosted potential V of the power supply node NDdd after the feed control transistor P3 is cut off.

$$Q = (Cp + C)Vdd \quad (2\text{-}1)$$

$$Q' = Cp * V + C'(V - Vdd) \quad (2\text{-}2)$$

Since the two electric charges Q and Q' are stored, Equation (3) is derived from the relation that the right-hand sides of the two equations are equal.

$$V = Vdd + \{C/(Cp + C')\}Vdd \quad (3)$$

The coupling ratio of {C/(Cp+C') is greater where C>C' than where C=C'. In other words, in the MIS capacitance 6 of one side open, the coupling ratio is greater where capacitance becomes small when boosted.

The MIS capacitance 6 has a large capacitance value because the channel capacitance is added to the overlapping capacitance of one impurity area of the source and the drain before boosted. However, when one of the source and the drain (the word line WL) is boosted, the channel is not formed, and the capacitance value is decreased. Therefore, as apparent from the equations, the MIS capacitance 6 has a greater coupling ratio when boosted than before boosted, and it can be boosted to higher voltage.

THIRD EMBODIMENT

Figure 11:
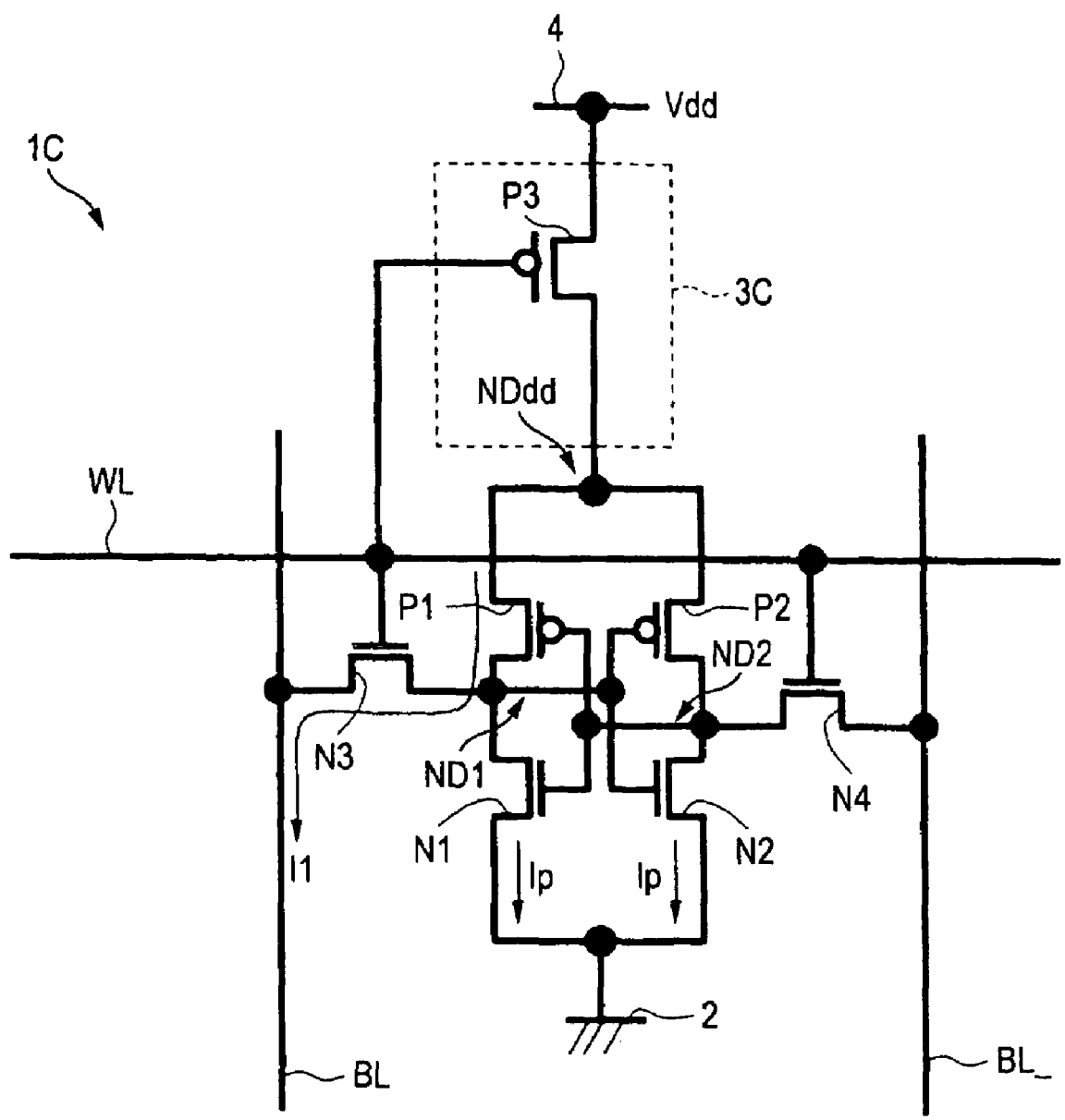
FIG. 11 shows a cell circuit diagram according to a third embodiment.

FIG. 11 shows a cell circuit (SRAM cell) 1C according to a third embodiment.

In this circuit, a voltage booster circuit 3C is configured of a single feed control transistor P3. The connection and the function of the feed control transistor P3 to the Vdd supply line 4, the power supply node NDdd and the word line WL are the same as those of the the first and the second embodiments. In addition, the other configurations in the cell circuit are the same as those in the first embodiment, omitting the description here.

In the cell circuit 1C shown in the drawing, the voltage settings in standby and in data write in the selected cell (data readout of the unselected cell) and the cell operation per se in accordance therewith are the same as those in the first embodiment.

When data is written in another cell circuit connected to the same word line WL, data is read out of the cell circuit 1C shown in the drawing. When the potential of the word line WL rises from the low level (the non-active level) to the high level (the active level) in this data read, the feed control transistor P3 is turned off, and the power supply node NDdd is electrically isolated from the Vdd supply line 4. When seen from the power supply node NDdd at this time, the channel of the feed control transistor P3 is not formed. Therefore, the channel capacitance having been added is eliminated (it is removed from the load capacitance of the power supply node NDdd) Thus, the capacitance of the power supply node NDdd becomes smaller than that at the time when the potential of the word line WL is at non-active level (for example, at zero V), and the voltage of the feeding point (the cell voltage Vcell) is increased.

On the other hand, as similar to the first embodiment, in the cell to be the target for data write, not shown, when the feed control transistor P3 is turned off to cut power supply to the pair of inverters, the penetration current in data inversion decreases the potential of the cell voltage Vcell to facilitate data write.

FIGS. 12 to 16 show exemplary layouts in midway of fabricating the SRAM cell 1C.

Figure 12:
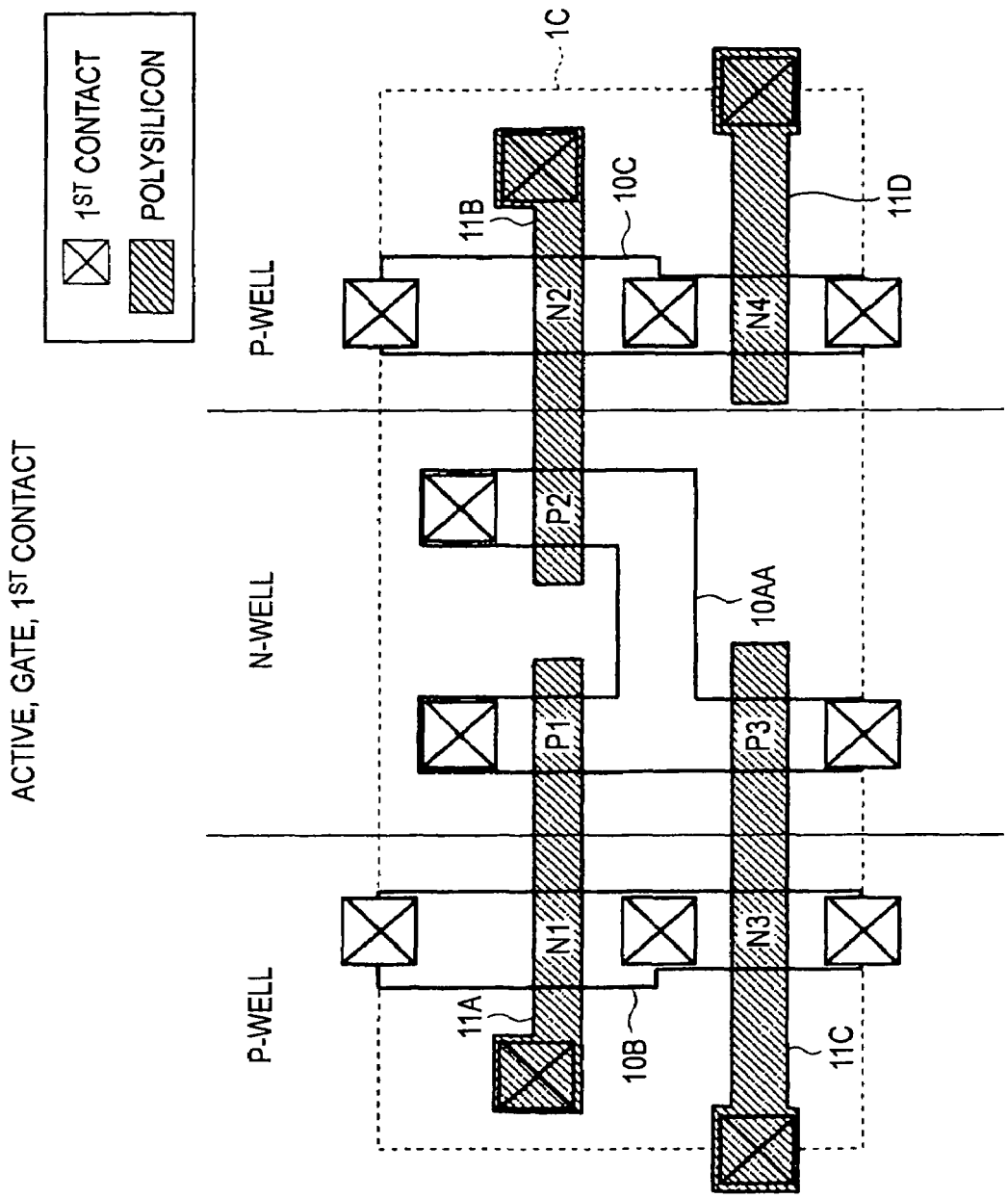
FIG. 12 shows a cell layout diagram after polysilicon is formed in regard to the third embodiment.

FIG. 12 corresponds to FIG. 4, FIG. 13 to FIG. 5, FIG. 14 to FIG. 6, FIG. 15 to FIG. 7, and FIG. 16 to FIG. 8 in the first embodiment. Hereinafter, the difference from the first embodiment will be described.

In FIG. 12, the first contact 1CTA shown in FIG. 4 is omitted. In addition, an active area 10AA configuring the power supply node NDdd has the pattern form that the contact portion is omitted from the active area 10A shown in FIG. 4.

Figure 13:
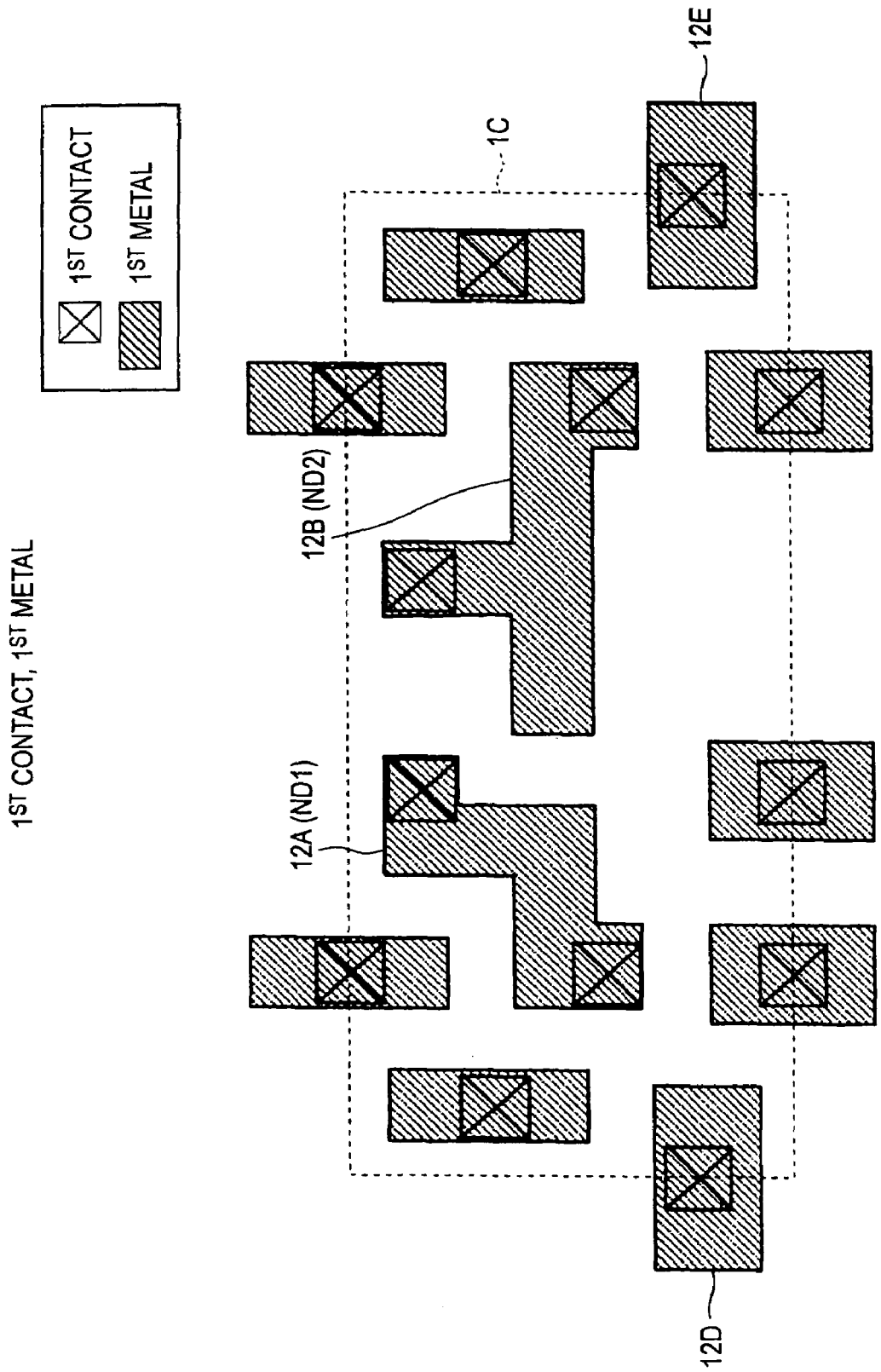
FIG. 13 shows a cell layout diagram after a first metal is wired in regard to the third embodiment.

In FIG. 13, the landing pad layer 12C shown in FIG. 5 and the first contact 1CTA thereunder are omitted.

Figure 14:
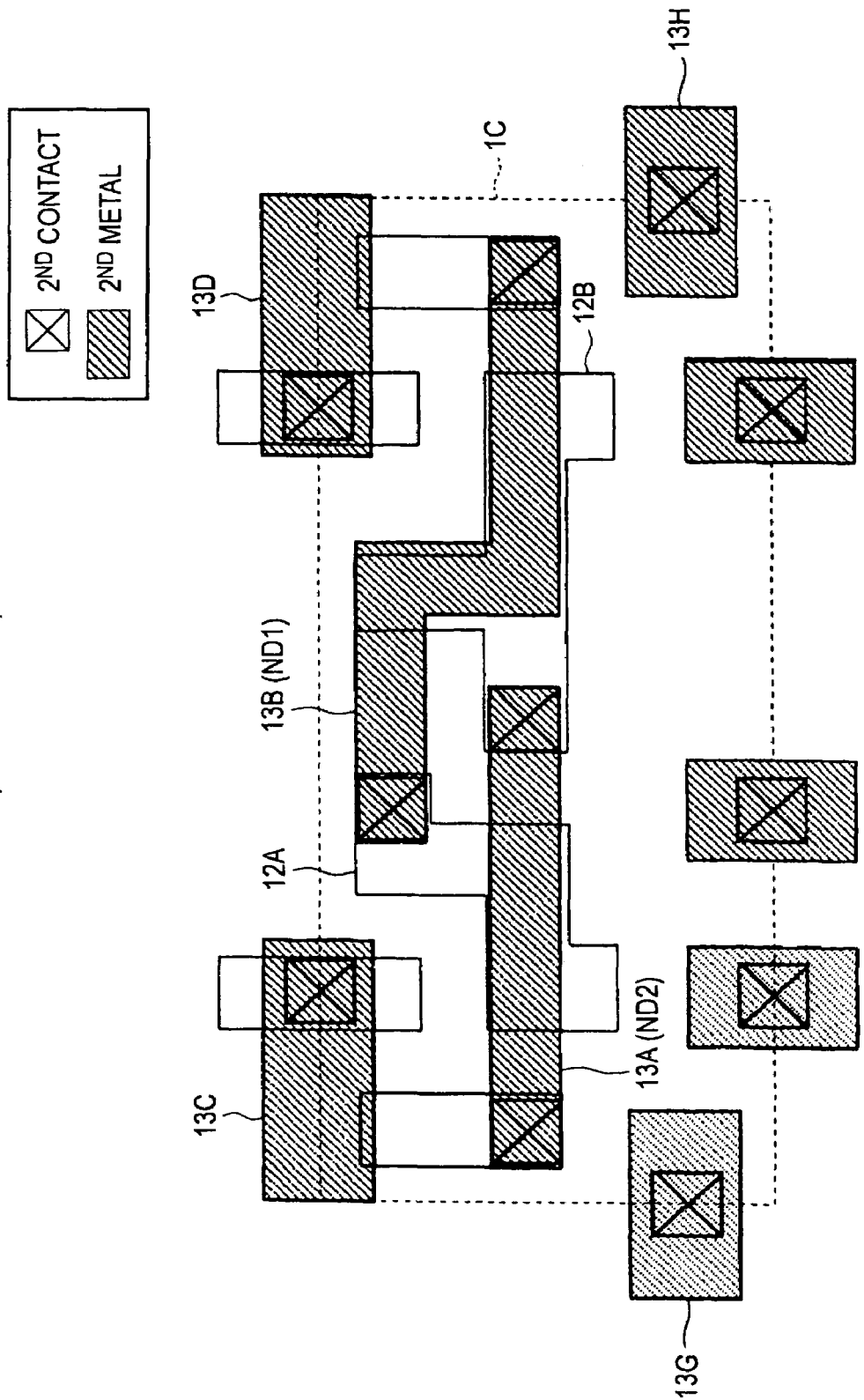
FIG. 14 shows a cell layout diagram after a second metal is wired in regard to the third embodiment.

In FIG. 14, the landing pad layer 13F shown in FIG. 6 and the second contact thereunder are omitted.

Figure 15:
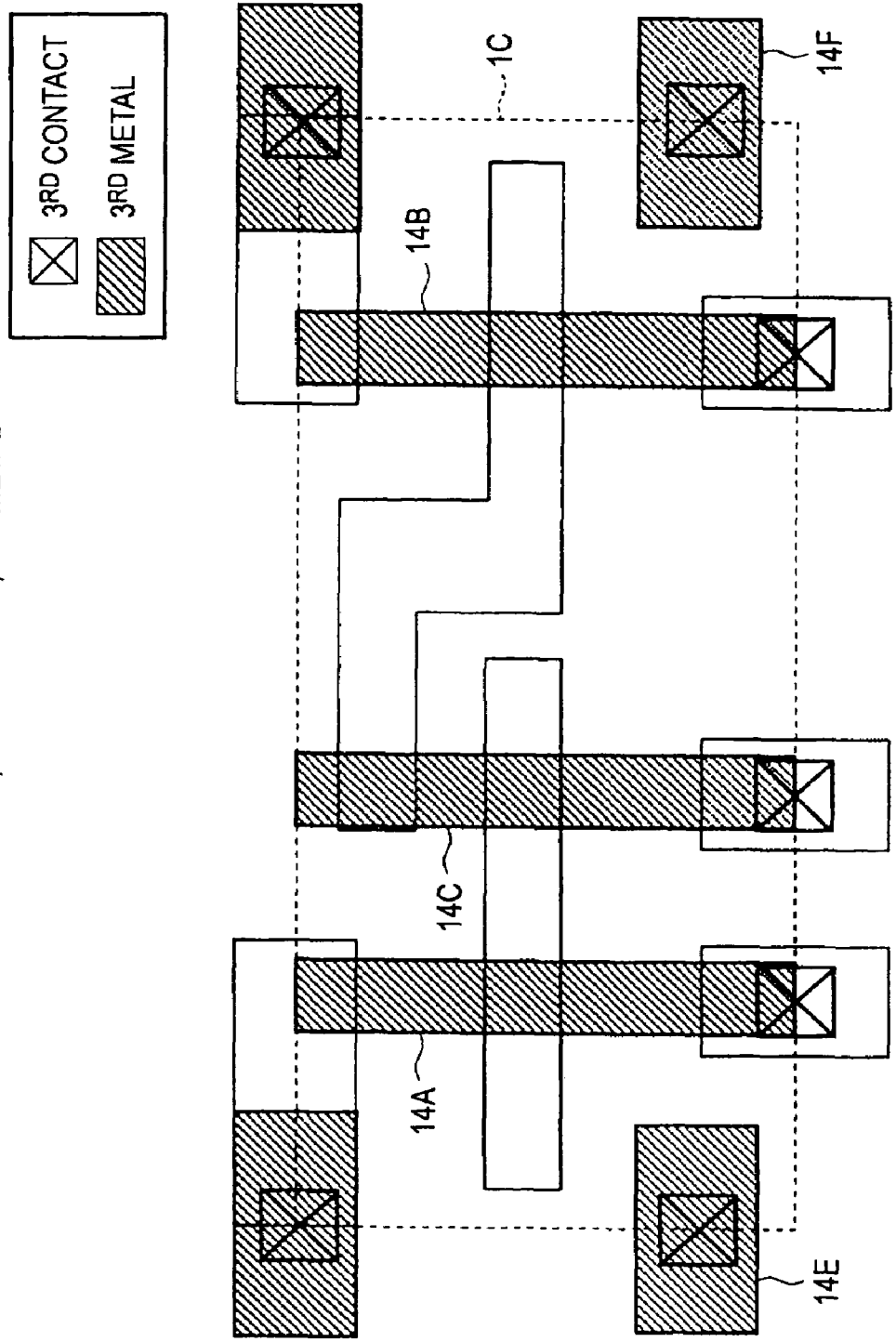
FIG. 15 shows a cell layout diagram after a third metal is wired in regard to the third embodiment.

In FIG. 15, the internal wiring layer 14D shown in FIG. 7 and the third contact thereunder are omitted.

Figure 16:
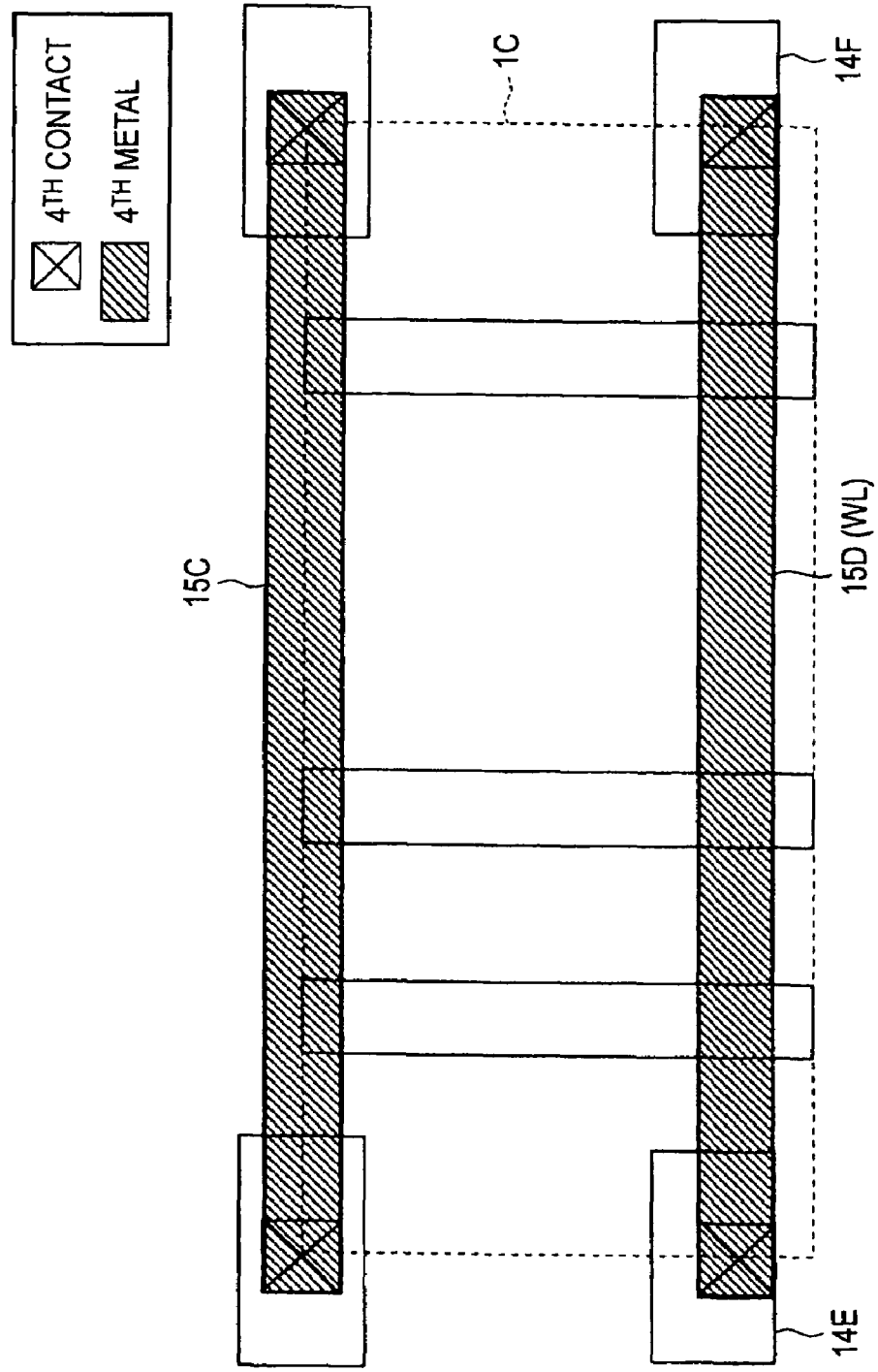
FIG. 16 shows a cell layout diagram after a fourth metal is wired in regard to the third embodiment.

In FIG. 16, the electrode layer 15A and the electrode layer 15B of the capacitor 5 shown in FIG. 8 are omitted, and instead of the electrode layer 15A, a internal wiring layer 15D is formed that is a parallel line with the GND internal wiring layer 15C. The internal wiring layer 15D configures the word line WL, which are connected to the landing pad layers 14E and 14F through the fourth contact, whereby they are connected to the gates of the transfer transistor N3, the transfer transistor N4 and the feed control transistor P3 shown in FIG. 12.

As described above, an exemplary pattern arrangement is implemented in which the capacitor 5 is omitted from the first embodiment.

FOURTH EMBODIMENT

Figure 17:
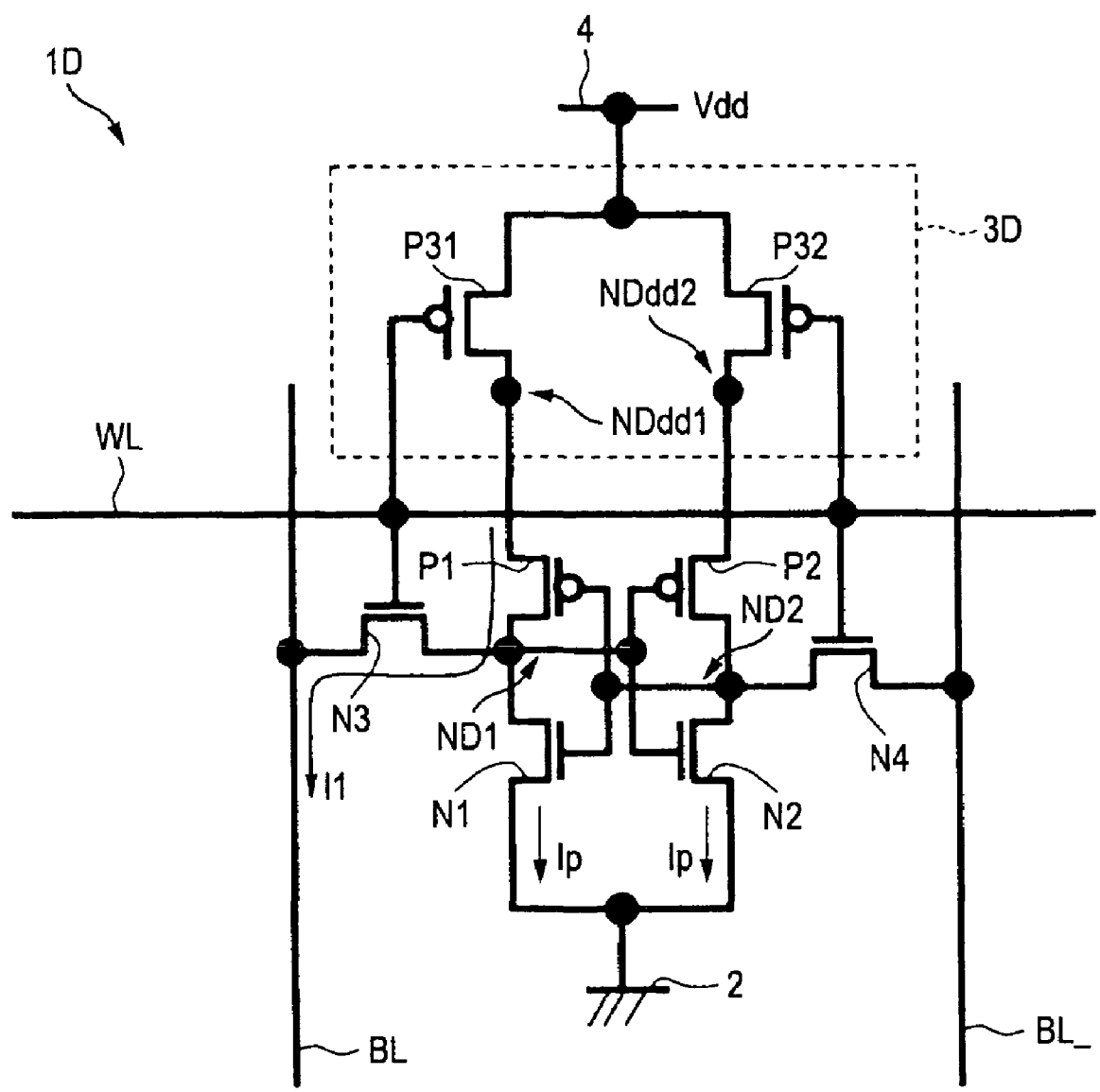
FIG. 17 shows a cell circuit diagram according to a fourth embodiment.

FIG. 17 shows a cell circuit (SRAM cell) 1D according to a fourth embodiment.

In this circuit, a voltage booster circuit 3D is configured of two feed control transistors P31 and P32. As shown in the drawing, the feed control transistors P31 and P32 can be configured of a PMOS transistor, for example.

The source of the feed control transistor P31 is connected to the Vdd supply line 4, the drain is connected to the source of the load transistor P1, and the gate is connected to the word line WL. The source of the feed control transistor P32 is connected to the Vdd supply line 4, the drain is connected to the source of the load transistor P2, and the gate is connected to the word line WL.

The connecting point of the feed control transistor P31 and the load transistor P1 is a first power supply node NDdd1, and the connecting point of the feed control transistor P32 and the load transistor P2 is a second power supply node NDdd2.

Both of the feed control transistors P31 and P32 serve as the same function as that of the feed control transistor P3 in the first and the second embodiments. In addition, the other configurations in the cell circuit are the same as those in the first embodiment, omitting the description here.

In the cell circuit 1D, the voltage settings in standby and in data write in the selected cell (data readout of the unselected cell) and the cell operation per se in accordance therewith are the same as those in the first embodiment.

When data is written in another cell circuit connected to the same word line WL, data is read out of the cell circuit 1D shown in the drawing. When the potential of the word line WL rises from the low level (the non-active level) to the high level (the active level) in this data read, the feed control transistors P31 and P32 are both turned off, and the first and the second power supply nodes NDdd1 and NDdd2 are electrically isolated from the Vdd supply line 4. When seen from the first power supply node NDdd1 at this time, the channel of the feed control transistor P31 is not formed. Therefore, the channel capacitance having been added is eliminated (it is removed from the load capacitance of the first power supply node NDdd1). Similarly, when seen from the second power supply node NDdd2, the channel of the feed control transistor P32 is not formed. Therefore, the channel capacitance having been added is eliminated (it is removed from the load capacitance of the second power supply node NDdd2). Thus, the capacitances of the first and the second power supply nodes NDdd1 and NDdd2 become smaller than that at the time when the potential of the word line WL is at non-active level (for example, at zero V) and the voltage of the feeding point is increased.

On the other hand, as similar to the first embodiment, in the cell to be the target for data write, not shown, when the feed control transistors P31 and P32 are turned off to cut power supply to the pair of inverters, the penetration current in data inversion deceases the potential of the cell voltage Vcell to facilitate data write.

FIGS. 18 to 22 show exemplary layouts in midway of fabricating the SRAM cell 1D.

Figure 18:
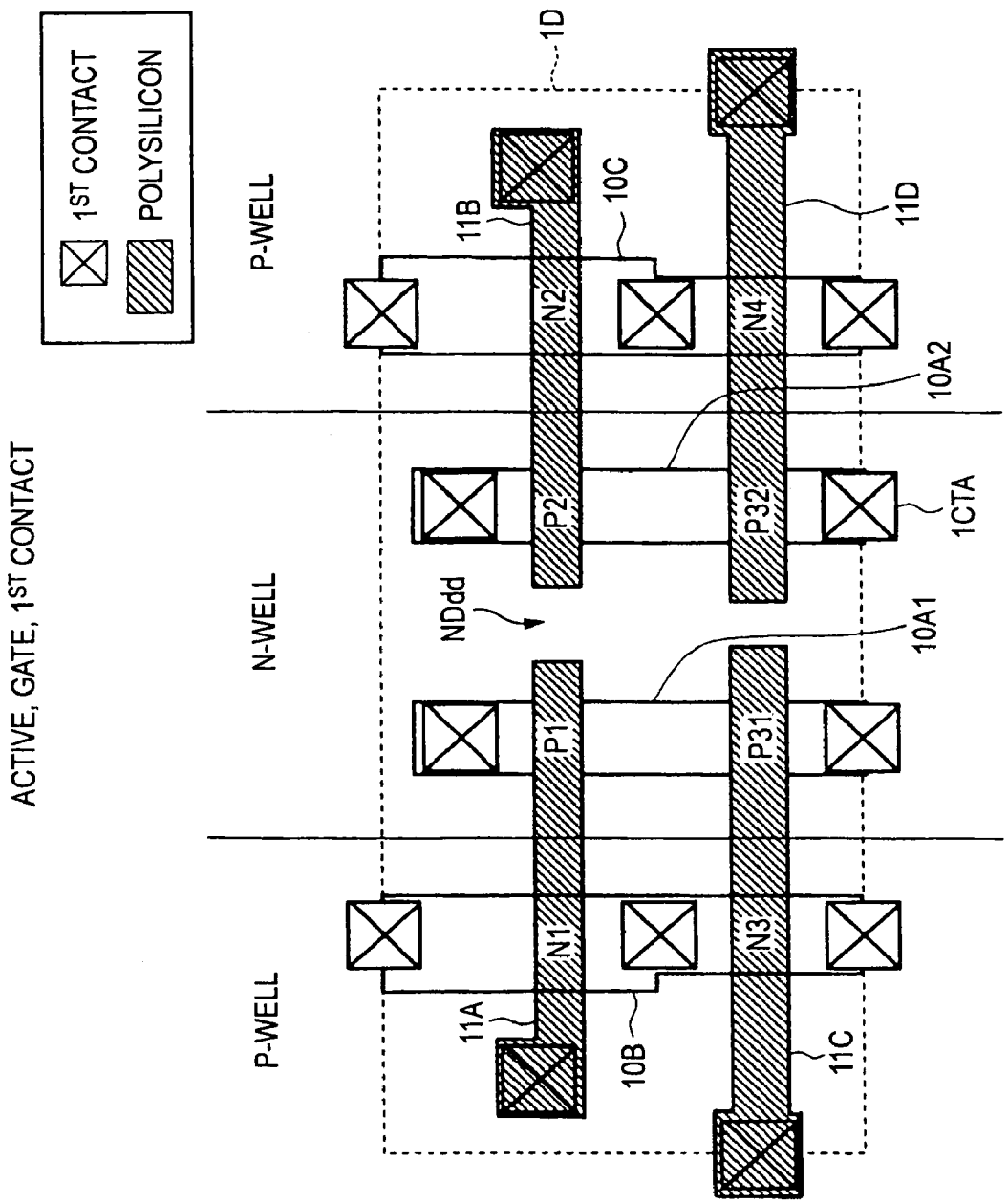
FIG. 18 shows a cell layout diagram after polysilicon is formed in regard to the fourth embodiment.
Figure 20:
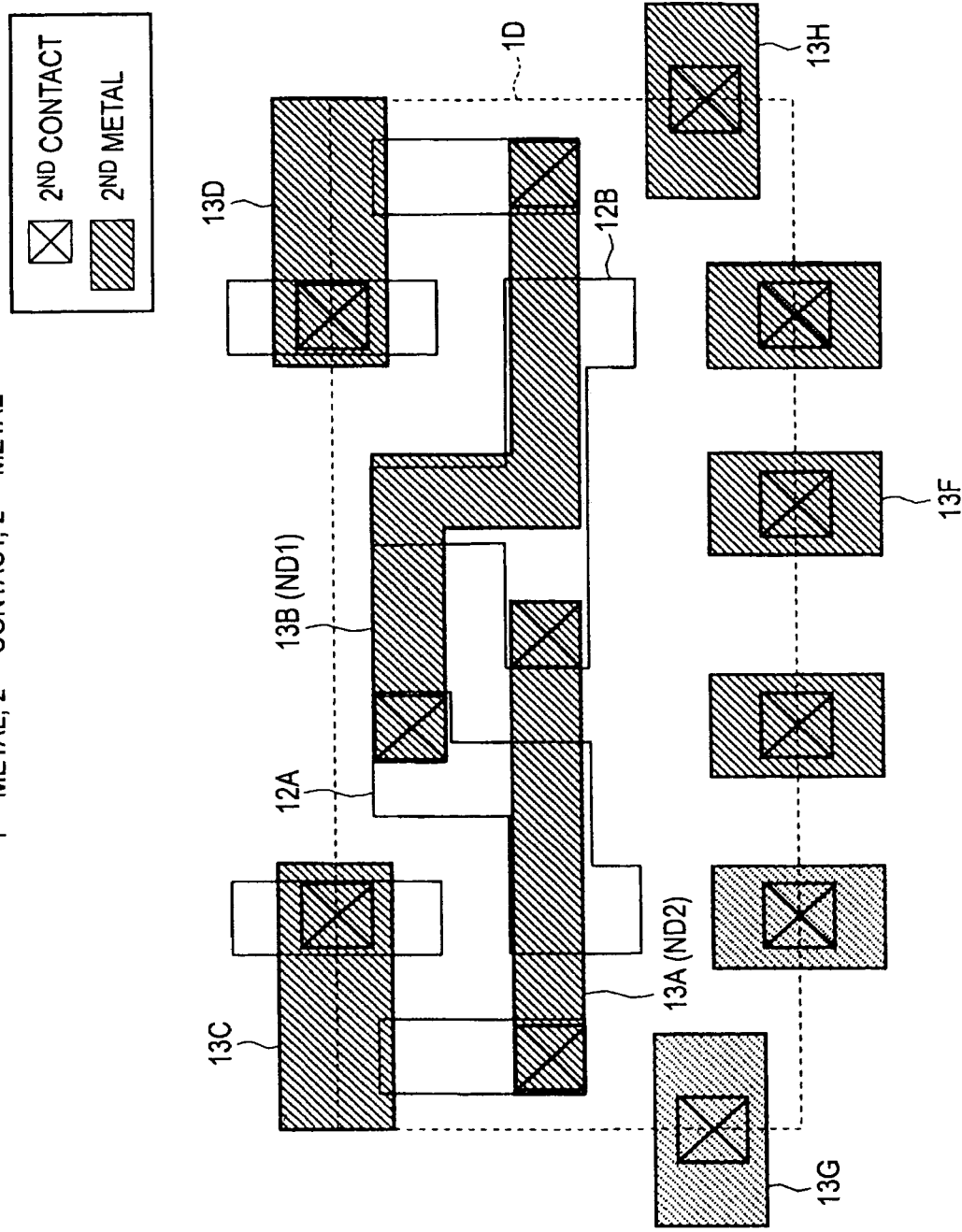
FIG. 20 shows a cell layout diagram after a second metal is wired in regard to the fourth embodiment.
Figure 21:
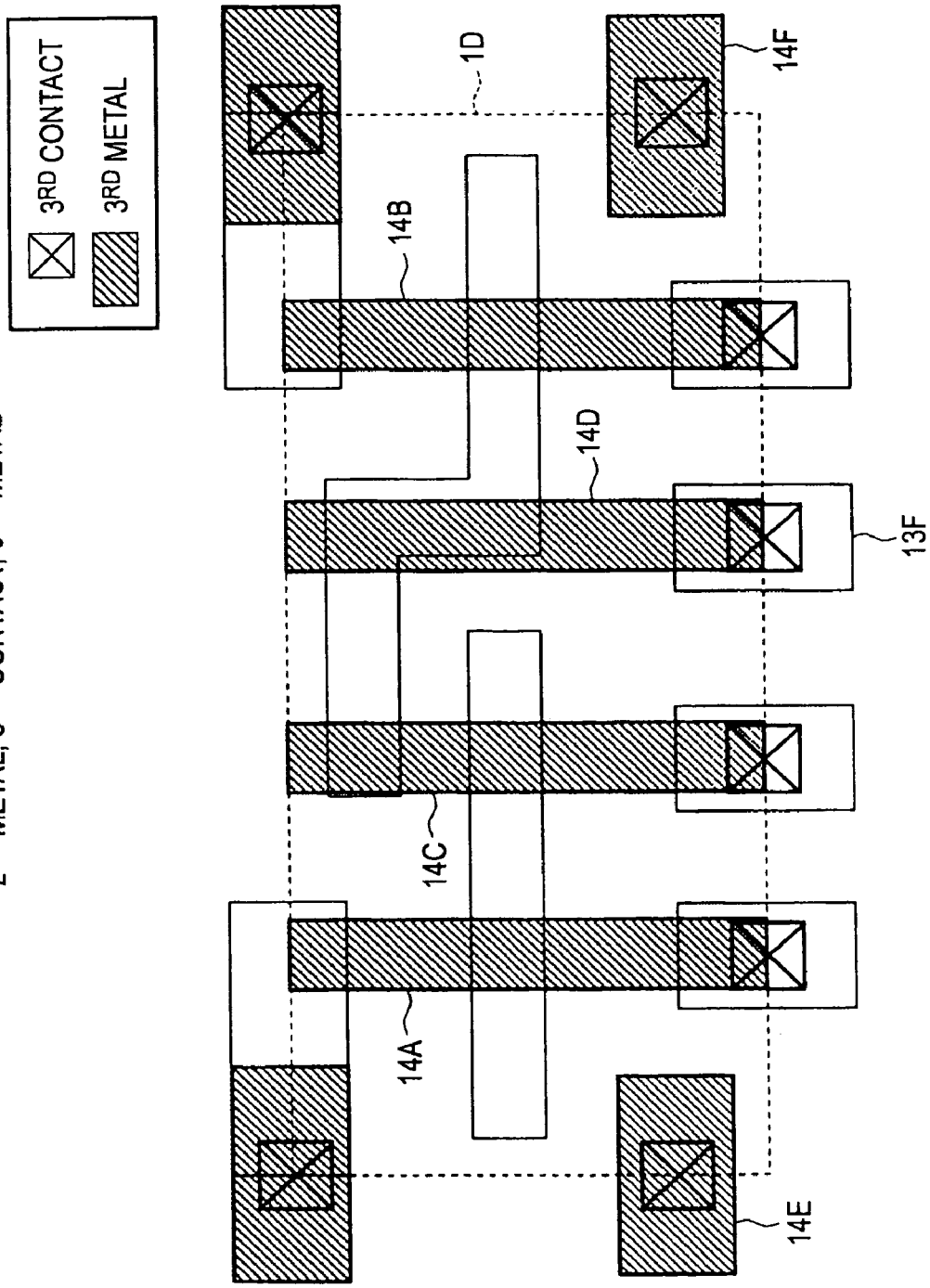
FIG. 21 shows a cell layout diagram after a third metal is wired in regard to the fourth embodiment.
Figure 22:
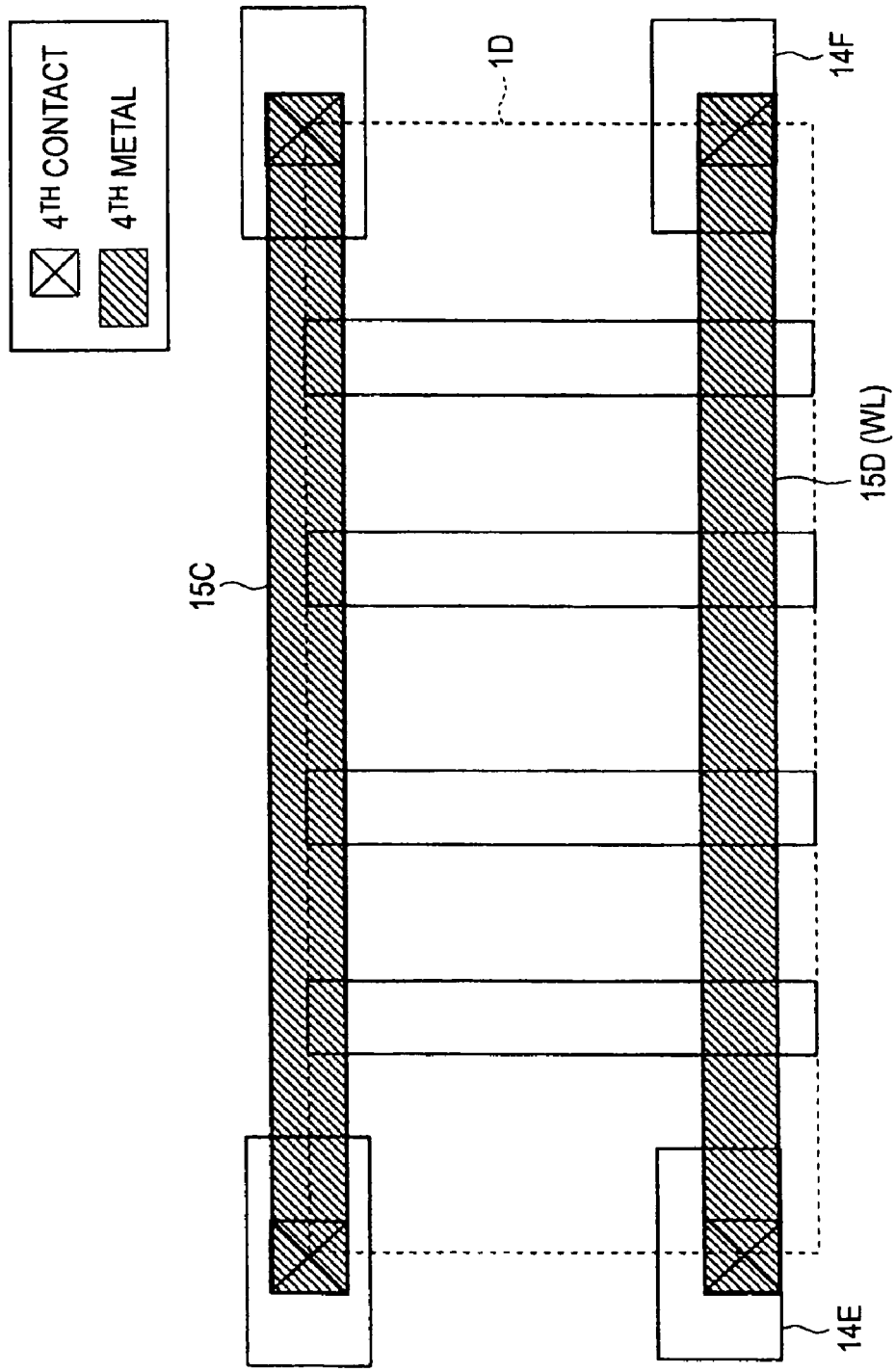
FIG. 22 shows a cell layout diagram after a fourth metal is wired in regard to the fourth embodiment.

FIG. 18 corresponds to FIG. 4, FIG. 19 to FIG. 5, FIG. 20 to FIG. 6, and FIG. 21 to FIG. 7 in the first embodiment, and FIG. 22 corresponds to FIG. 16 in the third embodiment. Hereinafter, the difference from the first embodiment and the third embodiment will be described.

In FIG. 18, the active area 10A shown in FIG. 4 is separated into an active area 10A1 on the load transistor P1 side and an active area 10A2 on the load transistor P2 side. The position of the first contact 1CTA shown in FIG. 4 is moved to near the border of the SRAM cell 1D. The active area 10A2 has the pattern form extended to the first contact 1CTA. Furthermore, the length of the gate wiring 11D is extended to cross the active area 10A2 extended in length. The feed control transistor P32 shown in FIG. 17 is formed at the intersection point. On the other hand, the feed control transistor P31 shown in FIG. 17 is formed at the place at which the feed control transistor P3 shown in FIG. 4 is formed.

Figure 19:
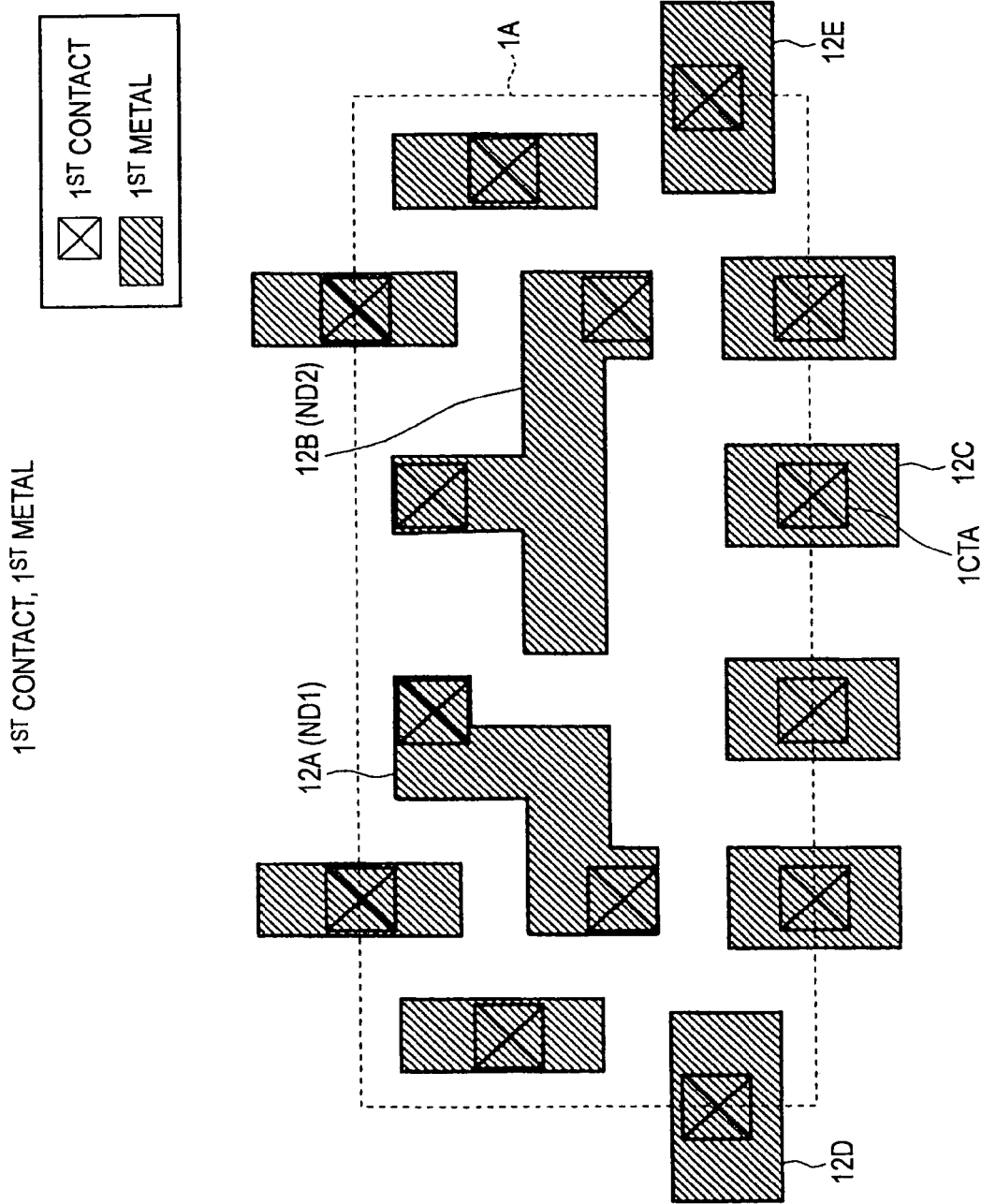
FIG. 19 shows a cell layout diagram after a first metal is wired in regard to the fourth embodiment.

In FIG. 19, in accordance with the position change of the first contact 1CTA shown in FIG. 18, the position and the pattern form of the landing pad layer 12C shown in FIG. 5 are changed.

Similarly, in FIG. 20, the position and the pattern of the landing pad layer 13F and the position of the second contact thereunder shown in FIG. 6 are changed.

Furthermore, in FIG. 21, the internal wiring layer 14D shown in FIG. 7 is connected to the landing pad layer 13F through the third contact thereunder whose pattern is changed so as to have the length of the short side of the SRAM cell 1D. In addition, the internal wiring layers 14D and 14C together configure the Vdd supply line.

In FIG. 22, as similar to FIG. 16, the GND internal wiring layer 15C and the internal wiring layer 15D are wired.

As described above, in addition to the feed control transistor P31 having the same arrangement as the feed control transistor P3, another feed control transistor P32 is added from the third embodiment. In this case, there is no additional cell area, and the feed control transistors P31 and P32 are arranged symmetrically.

According to the first to the fourth embodiments, the following advantages can be obtained.

The embodiments have no disadvantages such as the necessity of a plurality of power sources, the limitations on the array configuration, and the difficulty of complementary data output, which can implement the SRAM in low voltage operation. In other words, since the power supply voltage is temporarily boosted in data read, a single power source can conduct low voltage operation as well as accelerated read operation (see FIGS. 2A and 2B). Particularly, in write operation when data is rewritten, data write at high speed can be conducted without hampering data write even though the power supply voltage drops.

Accordingly, in a large scale memory cell array, rewrite operation can be conducted in a part of the memory cells in the word line sector, and power consumption can be reduced.

This can be implemented by adding the PMOS transistor and the capacitance to the SRAM cell in the past, and has high compatibility with logic process for easy implementation.

The descriptions above are the common advantage of the first to the fourth embodiments. Particularly in the second embodiment, since the MIS capacitance having the coupling ratio higher after boosted is used, it can be boosted to higher voltage, and a great advantage can be exerted even in an MIS capacitance having a small area.

In the third embodiment, as compared with the the first and the second embodiments, the capacitance added to the word line WL is small, and the delay of the rise of the potential of the word line WL can be suppressed.

In the fourth embodiment, as compared to the first to the third embodiments, the symmetry of the layout of the feed control transistor is high to facilitate pattern formation, and the characteristic variations due to pattern variations can be suppressed.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor memory device comprising SRAM cells each including:

a pair of inverters;

a feed control switch connected between a feeding point of the pair of inverters and a power supply voltage supply line; and boosting device configured to boost a voltage of the feeding point electrically isolated from the power supply voltage supply line by the feed control switch, wherein the boosting device comprises a capacitor which couples a word line to the feeding point by capacitive coupling.

2. The semiconductor memory device according to claim 1, wherein the SRAM cell each comprises:

a first transfer transistor arranged between an input of a second inverter configuring the pair of inverters and a first bit line and configured to turn on by changing a word line to active level; and a second transfer transistor arranged between an input of a first inverter configuring the pair of inverters and a second bit line and configured to turn on by changing the word line to active level, wherein the feed control switch is configured to turn on by changing the word line from non-active level to the active level.

3. The semiconductor memory device according to claim 1, wherein the feed control switch comprises a P-channel transistor in which a gate is connected to a word line.

4. The semiconductor memory device according to claim 2 or 3, wherein the boosting device comprises a capacitor (MIS capacitance) in an insulating gate transistor structure in which a source or a drain is connected to a word line, and a gate is connected to the feeding point.

* * * * *